US009378312B2

(12) United States Patent
Lepage et al.

(10) Patent No.: US 9,378,312 B2
(45) Date of Patent: Jun. 28, 2016

(54) FAULTED GEOLOGICAL STRUCTURES HAVING UNCONFORMITIES

(71) Applicant: Schlumberger Technology Corporation, Sugar Land, TX (US)

(72) Inventors: Francois Lepage, Montpellier (FR); Laurent Arnaud Souche, Montpellier (FR)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 520 days.

(21) Appl. No.: 13/791,927

(22) Filed: Mar. 9, 2013

(65) Prior Publication Data

US 2013/0238297 A1 Sep. 12, 2013

Related U.S. Application Data

(60) Provisional application No. 61/609,010, filed on Mar. 9, 2012.

(30) Foreign Application Priority Data

Mar. 9, 2012 (FR) ..................... 12 52161

(51) Int. Cl.
*G06F 7/60* (2006.01)
*G06F 17/10* (2006.01)
*G06F 17/50* (2006.01)
*G01V 1/28* (2006.01)
*G01V 99/00* (2009.01)
*G09B 23/40* (2006.01)

(52) U.S. Cl.
CPC .............. *G06F 17/5009* (2013.01); *G01V 1/28* (2013.01); *G01V 99/00* (2013.01); *G01V 99/005* (2013.01); *G09B 23/40* (2013.01); *G01V 2210/66* (2013.01)

(58) Field of Classification Search
None
See application file for complete search history.

(56) References Cited

U.S. PATENT DOCUMENTS

| 4,821,164 A | 4/1989 | Swanson |
| 6,100,893 A * | 8/2000 | Ensz ....................... G06T 17/20 345/420 |
| 2002/0072883 A1* | 6/2002 | Lim et al. ......................... 703/2 |
| 2011/0106507 A1 | 5/2011 | Lepage |
| 2011/0310101 A1 | 12/2011 | Prange et al. |

FOREIGN PATENT DOCUMENTS

| AU | 2007221943 A1 | 11/2007 |
| EP | 1070267 B1 | 12/2005 |

OTHER PUBLICATIONS

Iske et al., Mathematical Methods and Modelling in Hydrocarbon Exploration and Production, 2005, Springer, pp. 1-452.*

(Continued)

*Primary Examiner* — Omar Fernandez Rivas
*Assistant Examiner* — Bernard E Cothran

(57) ABSTRACT

A method can include providing a mesh of a geologic environment that includes conformable sequences and an unconformity; interpolating an implicit function defined with respect to the mesh to provide values for the implicit function; and identifying an iso-surface based on a portion of the values where the iso-surface represents the unconformity as residing between two of the conformable sequences. Various other apparatuses, systems, methods, etc., are also disclosed.

20 Claims, 13 Drawing Sheets

(56) References Cited

OTHER PUBLICATIONS

"Modelisation D'Objets Naturels par Formulation Implicite", by David Ledez, PhD Dissertation, Institute National Polytechnique de Lorraine Oct. 28, 2003; pp. 31-38, pp. 49-54, pp. 110-111, and pp. 113-116.

Chaodong, et al., "Rapid geological modeling by using implicit 3D potential field interpolation method", International Conference on Computer Design and Applications, vol. 5, Jun. 25, 2010, pp. V5-50 to V5-V53.

Frank, et al., "3D-reconstruction of complex geological interfaces from irregularly distributed and noisy point data", Computers & Geosciences, vol. 33 (7), Jul. 2007, pp. 932-943.

Mallett, Jean-Laurent, "Chapter 3: Section 3.6: Implicit surfaces", "Chapter 6: Section 6.3: Modeling a faulted surface", and "Chapter 8: Section 8.2.6 On-lap and off-lap sedimentary styles", Geomodeling, Oxford University Press, New York, 2002, pp: 134-138, pp. 272-273, and pp. 387-389.

* cited by examiner

Control Point Constraints 510

$$[1, x^*, y^*, z^*] \cdot M^{-1} \cdot \begin{bmatrix} \varphi(a_0) \\ \varphi(a_1) \\ \varphi(a_2) \\ \varphi(a_3) \end{bmatrix} = \phi$$

Where: $M = \begin{bmatrix} 1 & x_0 & y_0 & z_0 \\ 1 & x_1 & y_1 & z_1 \\ 1 & x_2 & y_2 & z_2 \\ 1 & x_3 & y_3 & z_3 \end{bmatrix}$

Linear System 530

$$A = \begin{bmatrix} C_{\text{harmonic equations}} \\ C_{\text{control point equations}} \\ C_{\text{gradient equations}} \\ C_{\text{const. gradient equations}} \end{bmatrix} \quad F = \begin{bmatrix} 0 \\ \phi_{\text{control point}} \\ \phi_{\text{gradient}} \\ 0 \end{bmatrix}$$

(Number of Nodes × Number of Constraints)

$$A\varphi = F$$

Fig. 5

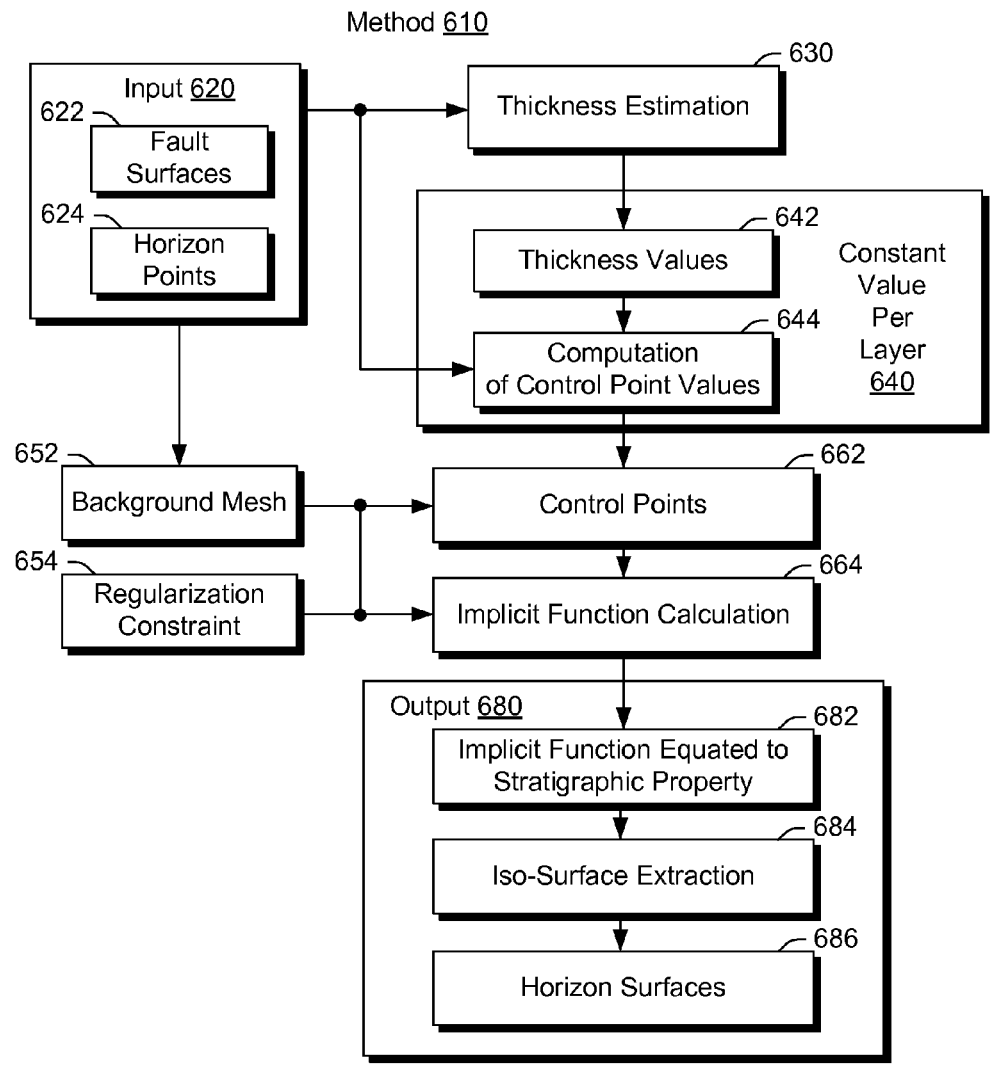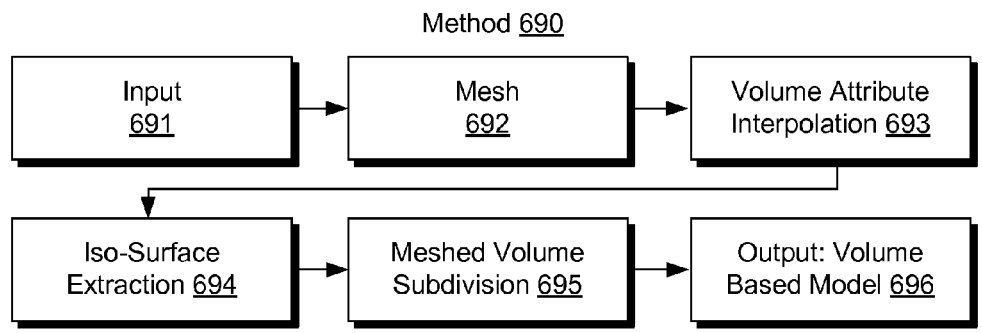
Fig. 6

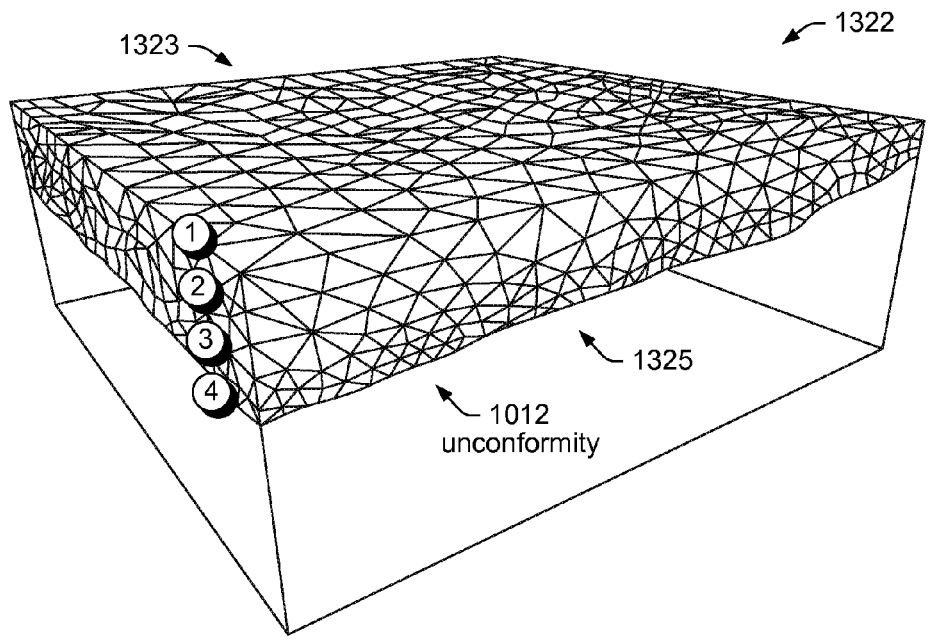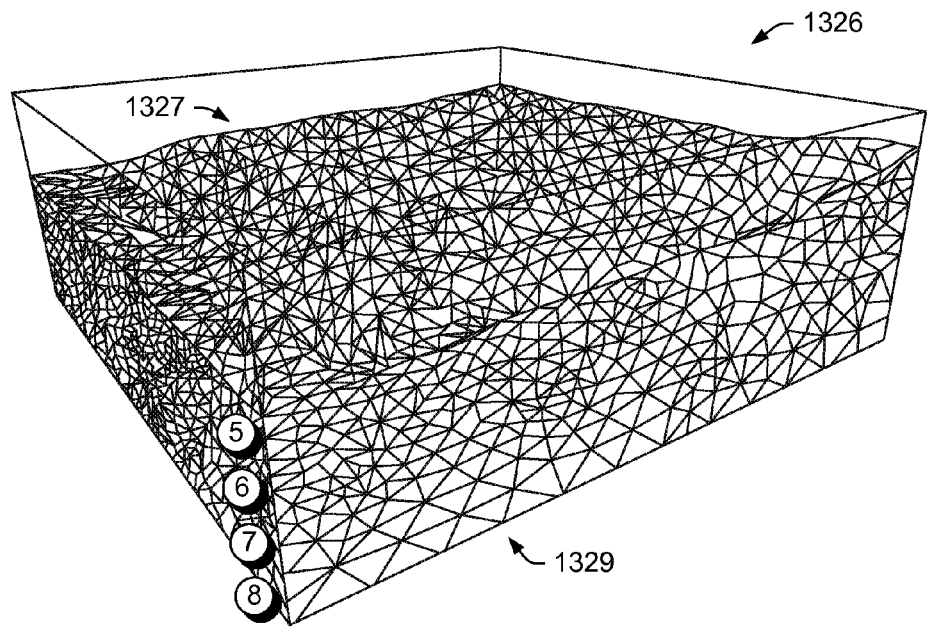
Fig. 13

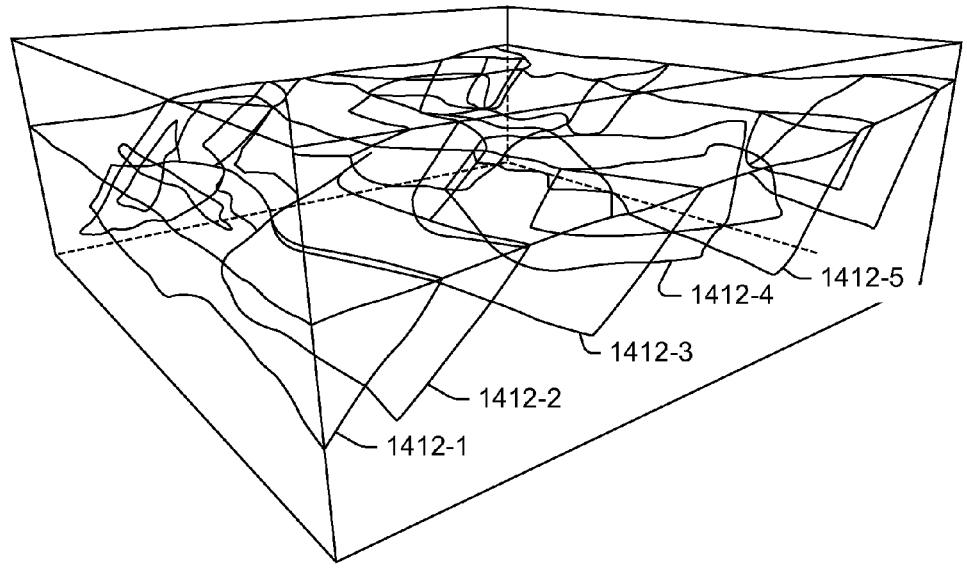
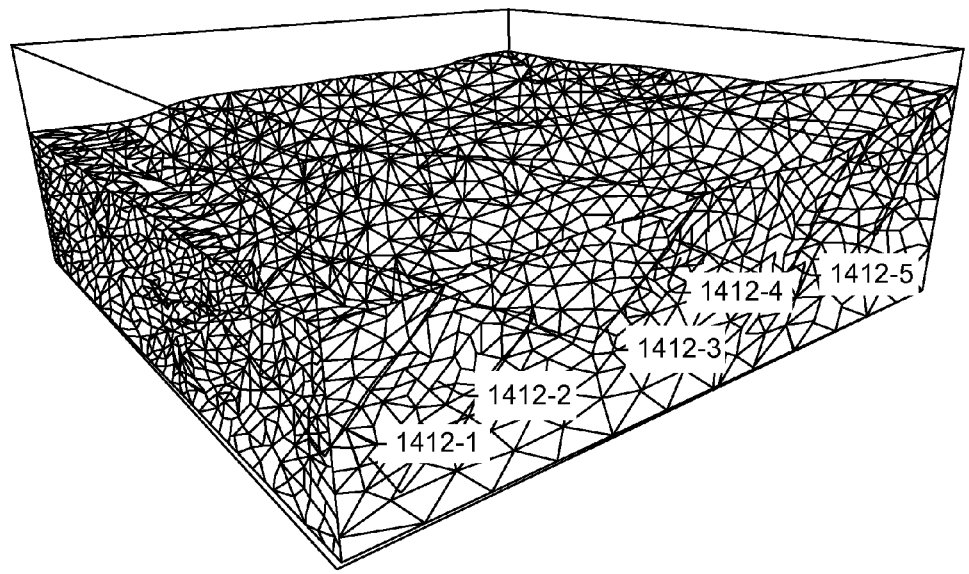
Fig. 14

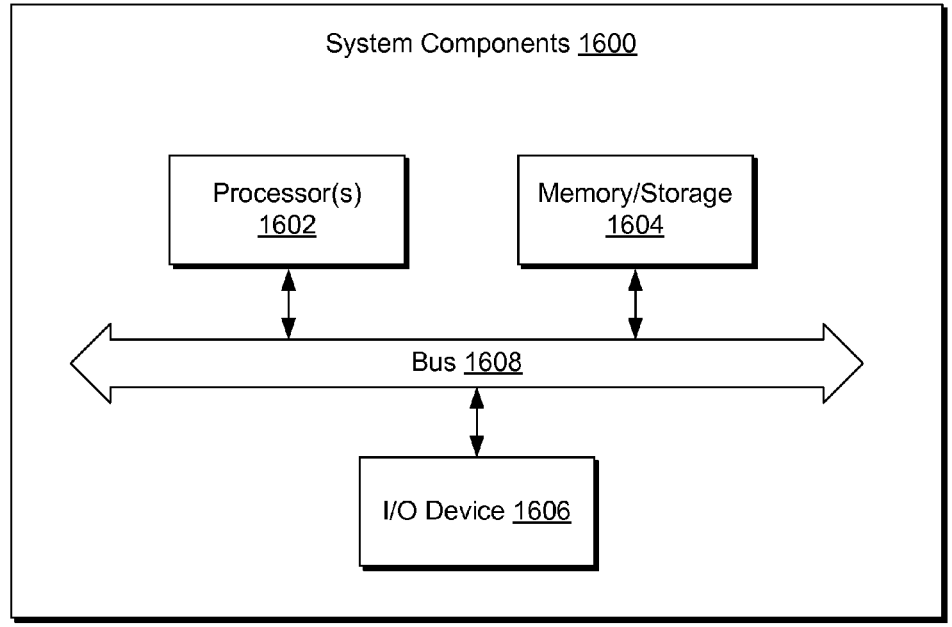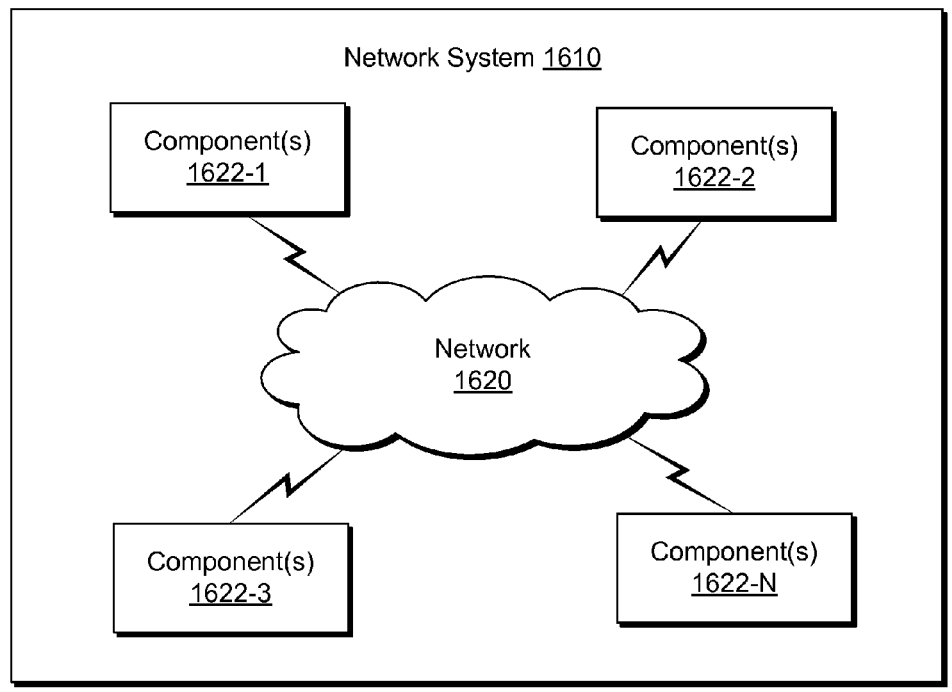
Fig. 16

FAULTED GEOLOGICAL STRUCTURES HAVING UNCONFORMITIES

RELATED APPLICATION

This application claims priority to and the benefit of Patent Application FR (France) 1252161, filed 9 Mar. 2012, entitled "Faulted Geological Structures Containing Unconformities," to inventors Francois Lepage and Laurent Souche, the disclosure of which is incorporated by reference herein in its entirety.

BACKGROUND

Phenomena associated with a sedimentary basin may be modeled using a mesh, a grid, etc. As an example, a structural model may be created based on data associated with a sedimentary basin. For example, where a basin includes various types of features (e.g., stratigraphic layers, faults, etc.), data associated with such features may be used to create a structural model of the basin. Such a model may be a basis for analysis, further modeling, etc. Various technologies, techniques, etc., described herein pertain to structural modeling, structural models, etc.

SUMMARY

A method can include providing a mesh of a geologic environment that includes conformable sequences and an unconformity; interpolating an implicit function defined with respect to the mesh to provide values for the implicit function; and identifying an iso-surface based on a portion of the values where the iso-surface represents the unconformity as residing between two of the conformable sequences. A system can include a processor; memory operatively coupled to the processor; and one or more modules stored in the memory that include instructions executable by the processor to instruct the system to: provide a mesh of a geologic environment that comprises conformable sequences and at least one unconformity; interpolate an implicit function defined with respect to the mesh to provide values for the implicit function; and identify an iso-surface based on a portion of the values where the iso-surface represents one of the at least one unconformity as residing between two of the conformable sequences. One or more computer-readable storage media can include computer-executable instructions to instruct a computing device to: provide a mesh of a geologic environment that include conformable sequences and at least one unconformity; interpolate an implicit function defined with respect to the mesh to provide values for the implicit function; and identify an iso-surface based on a portion of the values where the iso-surface represents one of the at least one unconformity as residing between two of the conformable sequences. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 5 illustrates examples of formulations;

FIG. 6 illustrates examples of methods;

FIG. 13 illustrates an example of a mesh split into a first mesh and a second mesh;

FIG. 14 illustrates an example of faults in a volume of interest and an example of a mesh for the volume of interest;

FIG. 16 illustrates example components of a system and a networked system.

DETAILED DESCRIPTION

Figure 1:
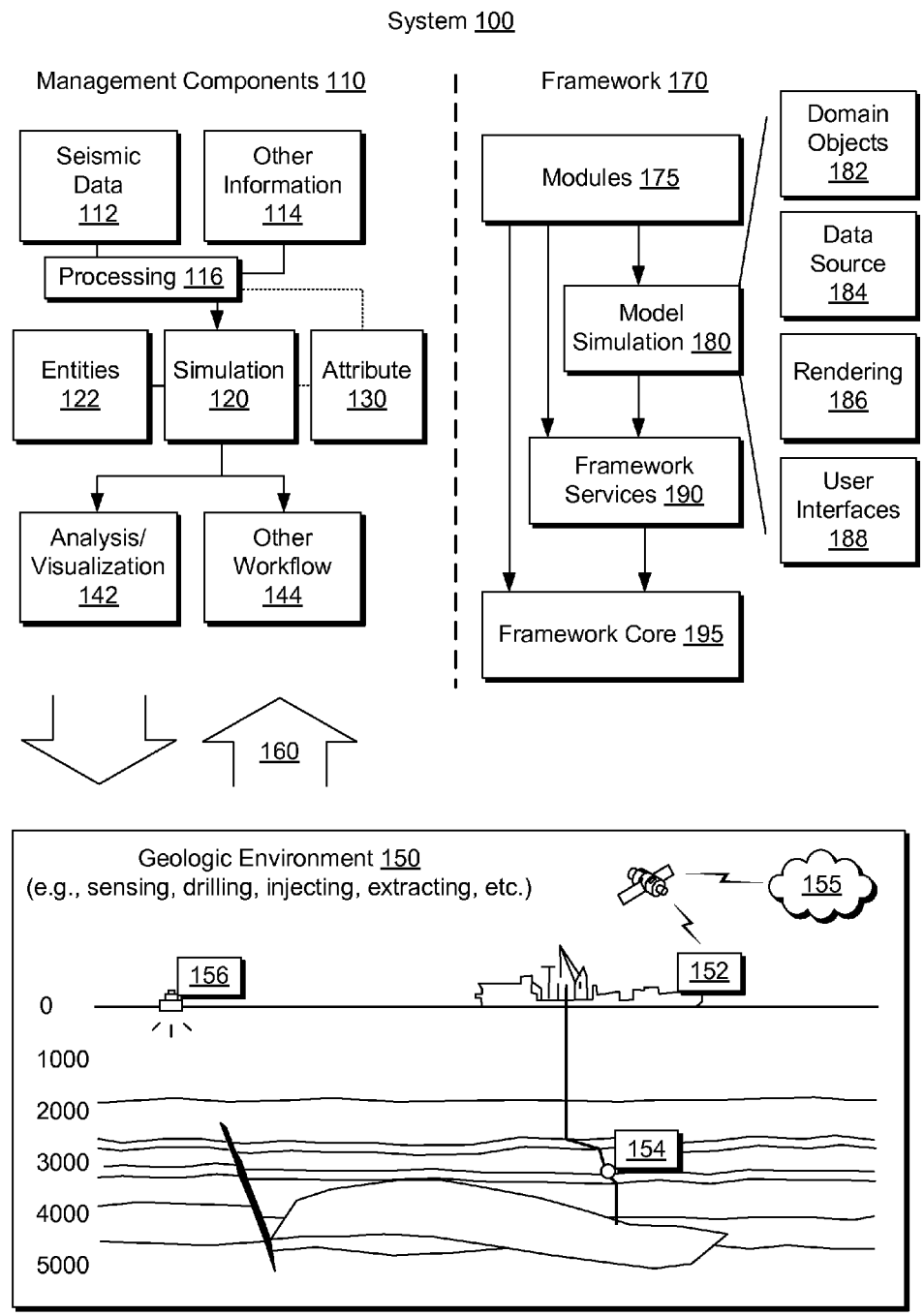
FIG. 1 illustrates an example system that includes various components for simulating a geological environment.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Phenomena associated with a sedimentary basin (e.g., a subsurface region, whether below a ground surface, water surface, etc.) may be modeled using a model or models. As an example, a structural model of a basin may find use for understanding various processes related to exploration and production of natural resources (estimating reserves in place, drilling wells, forecasting production, etc.). As an example, a structural model may be used as a basis for building a model for use with a numerical technique.

For application of a numerical technique, equations may be discretized using a grid that includes nodes, cells, etc. To represent features in a geologic environment, a structural model may assist with properly locating nodes, cells, etc. of a grid for use in simulation using one or more numerical techniques. As an example, a structural model may itself include a mesh, which may, at times be referred to as a grid. As an example, a structural model may provide for analysis optionally without resorting to creation of a grid suited for discretization of equations for a numerical solver (e.g., consider a structured grid that may reduce computational demands, etc.).

As to numerical techniques, a numerical technique such as the finite difference method can include discretizing a 1D differential heat equation for temperature with respect to a spatial coordinate to approximate temperature derivatives (e.g., first order, second order, etc.). Where time is of interest, a derivative of temperature with respect to time may also be provided. As to the spatial coordinate, the numerical technique may rely on a spatial grid that includes various nodes where a temperature will be provided for each node upon solving the heat equation (e.g., subject to boundary conditions, generation terms, etc.). Such an example may apply to multiple dimensions in space (e.g., where discretization is applied to the multiple dimensions). Thus, a grid may discretize a volume of interest (VOI) into elementary elements (e.g., cells or grid blocks) that may be assigned or associated with properties (e.g. porosity, rock type, etc.), which may be germane to simulation of physical processes (e.g., fluid flow, reservoir compaction, etc.).

As another example of a numerical technique, consider the finite element method where space may be represented by one dimensional or multidimensional "elements". For one spatial dimension, an element may be represented by two nodes positioned along a spatial coordinate. For multiple spatial dimensions, an element may include any number of nodes. Further, some equations may be represented by certain nodes while others are represented by fewer nodes (e.g., consider an example for the Navier-Stokes equations where fewer nodes represent pressure). The finite element method may include providing nodes that can define triangular elements (e.g., tetrahedra in 3D, higher order simplexes in multidimensional spaces, etc.) or quadrilateral elements (e.g., hexahedra or pyramids in 3D, etc.), or polygonal elements (e.g., prisms in 3D, etc.). Such elements, as defined by corresponding nodes of a grid, may be referred to as grid cells.

Yet another example of a numerical technique is the finite volume method. For the finite volume method, values for model equation variables may be calculated at discrete places on a grid, for example, a node of the grid that includes a "finite volume" surrounding it. The finite volume method may apply the divergence theorem for evaluation of fluxes at surfaces of each finite volume such that flux entering a given finite volume equals that leaving to one or more adjacent finite volumes (e.g., to adhere to conservation laws). For the finite volume method, nodes of a grid may define grid cells.

As mentioned, where a sedimentary basin (e.g., subsurface region) includes various types of features (e.g., stratigraphic layers, faults, etc.) where nodes, cells, etc. of a mesh or grid may represent, or be assigned to, such features. As an example, consider a structural model that may include one or more meshes. Such a model may serve as a basis for formation of a grid for discretized equations to represent a sedimentary basin and its features.

As to a stratigraphic sequence, a sedimentary basin may include sedimentary deposits grouped into stratigraphic units, for example, based on any of a variety of factors, to approximate or represent time lines that place stratigraphy in a chronostratigraphic framework. While sequence stratigraphy is mentioned, lithostratigraphy may be applied, for example, based on similarity of lithology of rock units (e.g., rather than time-related factors).

As an example, a mesh may conform to structural features such as, for example, Y-faults, X-faults, low-angle unconformities, salt bodies, intrusions, etc. (e.g., geological discontinuities), to more fully capture complexity of a geological model. As an example, a mesh may optionally conform to stratigraphy (e.g., in addition to one or more geological discontinuities). As to geological discontinuities, these may include model discontinuities such as one or more model boundaries. As an example, a mesh may be populated with property fields generated, for example, by geostatistical methods.

In general, a relationship may exist between node spacing and phenomenon or phenomena being modeled. Various scales may exist within a geologic environment, for example, a molecular scale may be on the order of approximately $10^{-9}$ to approximately $10^{-8}$ meters, a pore scale may be on the order of approximately $10^{-6}$ to approximately $10^{-3}$ meters, bulk continuum may be on the order of approximately $10^{-3}$ to approximately $10^{-2}$ meters, and a basin scale on the order of approximately $10^3$ to approximately $10^5$ meters. As an example, nodes of a mesh may be selected based at least in part on the type of phenomenon or phenomena being modeled (e.g., to select nodes of appropriate spacing or spacings). As an example, nodes of a grid may include node-to-node spacing of about 10 meters to about 500 meters. In such an example, a basin being modeled may span, for example, over approximately $10^3$ meters. As an example, node-to-node space may vary, for example, being smaller or larger than the aforementioned spacings.

Some data may be involved in building an initial mesh and, thereafter, a model, a corresponding mesh, etc. may optionally be updated in response to model output, changes in time, physical phenomena, additional data, etc. Data may include one or more of the following: depth or thickness maps and fault geometries and timing from seismic, remote-sensing, electromagnetic, gravity, outcrop and well log data. Furthermore, data may include depth and thickness maps stemming from facies variations.

FIG. 1 shows an example of a system 100 that includes various management components 110 to manage various aspects of a geologic environment 150 (e.g., an environment that includes a sedimentary basin). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114).

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT®.NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120. Alternatively, or in addition, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. Additionally, or alternatively, output from the simulation component 120 may be input to one or more other workflows, as indicated by a workflow component 144.

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a reservoir or reservoirs may be simulated with respect to one or more enhanced recovery techniques (e.g., consider a thermal process such as SAGD, etc.). As an example, a simulator may accept as input a grid such as, for example, a structured grid for purposes of simulating one or more physical phenomena. As an example, such a structured grid may be generated by transforming a grid in a computational space to a grid in a real space, for example, where one or more faults have been introduced into the grid in the computational space such that the one or more faults exist in the structured grid in the real space (e.g., structured according to an indexing system).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for seamless integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

As an example, a method may include structural modeling, for example, building a structural model, editing a structural model, etc. of a geologic environment. As an example, a workflow may include providing a structural model prior to construction of a grid (e.g., using the structural model), which may, in turn, be suitable for use with one or more numerical techniques. As an example, one or more applications may operate on a structural model (e.g., input of a structural model).

Figure 2:
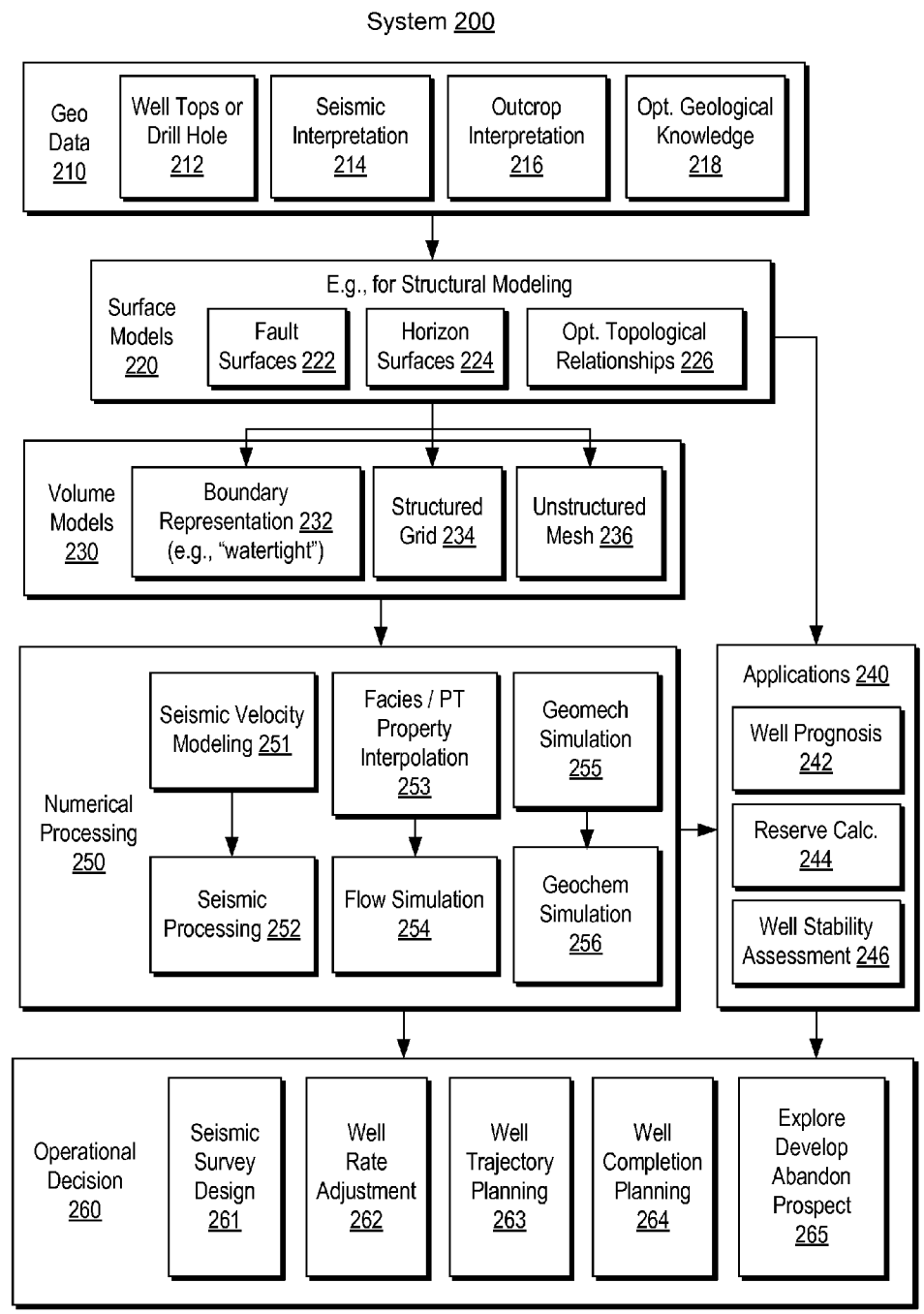
FIG. 2 illustrates an example of a system.

FIG. 2 shows an example of a system 200 that includes a geological/geophysical data block 210, a surface models block 220 (e.g., for one or more structural models), a volume modules block 230, an applications block 240, a numerical processing block 250 and an operational decision block 260. As shown in the example of FIG. 2, the geological/geophysical data block 210 can include data from well tops or drill holes 212, data from seismic interpretation 214, data from outcrop interpretation and optionally data from geological knowledge. As to the surface models block 220, it may provide for creation, editing, etc. of one or more surface models based on, for example, one or more of fault surfaces 222, horizon surfaces 224 and optionally topological relationships 226. As to the volume models block 230, it may provide for creation, editing, etc. of one or more volume models based on, for example, one or more of boundary representations 232 (e.g., to form a watertight model), structured grids 234 and unstructured meshes 236.

As shown in the example of FIG. 2, the system 200 may allow for implementing one or more workflows, for example, where data of the data block 210 are used to create, edit, etc. one or more surface models of the surface models block 220, which may be used to create, edit, etc. one or more volume models of the volume models block 230. As indicated in the example of FIG. 2, the surface models block 220 may provide one or more structural models, which may be input to the applications block 240. For example, such a structural model may be provided to one or more applications, optionally without performing one or more processes of the volume models block 230 (e.g., for purposes of numerical processing by the numerical processing block 250). Accordingly, the system 200 may be suitable for one or more workflows for structural modeling (e.g., optionally without performing numerical processing per the numerical processing block 250).

As to the applications block 240, it may include applications such as a well prognosis application 242, a reserve calculation application 244 and a well stability assessment application 246. As to the numerical processing block 250, it may include a process for seismic velocity modeling 251 followed by seismic processing 252, a process for facies and petrotechnical property interpolation 253 followed by flow simulation 254, and a process for geomechanical simulation 255 followed by geochemical simulation 256. As indicated, as an example, a workflow may proceed from the volume models block 230 to the numerical processing block 250 and then to the applications block 240 and/or to the operational decision block 260. As another example, a workflow may proceed from the surface models block 220 to the applications block 240 and then to the operational decisions block 260 (e.g., consider an application that operates using a structural model).

In the example of FIG. 2, the operational decisions block 260 may include a seismic survey design process 261, a well rate adjustment process 252, a well trajectory planning process 263, a well completion planning process 264 and a process for one or more prospects, for example, to decide whether to explore, develop, abandon, etc. a prospect.

Referring again to the data block 210, the well tops or drill hole data 212 may include spatial localization, and optionally surface dip, of an interface between two geological formations or of a subsurface discontinuity such as a geological fault; the seismic interpretation data 214 may include a set of points, lines or surface patches interpreted from seismic reflection data, and representing interfaces between media (e.g., geological formations in which seismic wave velocity differs) or subsurface discontinuities; the outcrop interpretation data 216 may include a set of lines or points, optionally associated with measured dip, representing boundaries between geological formations or geological faults, as interpreted on the earth surface; and the geological knowledge data 218 may include, for example knowledge of the paleo-tectonic and sedimentary evolution of a region.

As to a structural model, it may be, for example, a set of gridded or meshed surfaces representing one or more interfaces between geological formations (e.g., horizon surfaces) or mechanical discontinuities (fault surfaces) in the subsurface. As an example, a structural model may include some information about one or more topological relationships between surfaces (e.g. fault A truncates fault B, fault B intersects fault C, etc.).

As to the one or more boundary representations 232, they may include a numerical representation in which a subsurface model is partitioned into various closed units representing geological layers and fault blocks wherein an individual unit may be defined by its boundary and, optionally, by a set of internal boundaries such as fault surfaces.

As to the one or more structured grids 234, it may include a grid that partitions a volume of interest into different elementary volumes (cells), for example, that may be indexed according to a pre-defined, repeating pattern. As to the one or more unstructured meshes 236, it may include a mesh that partitions a volume of interest into different elementary volumes, for example, that may not be readily indexed following a pre-defined, repeating pattern (e.g., consider a Cartesian cube with indexes I, J, and K, along x, y, and z axes).

As to the seismic velocity modeling 251, it may include calculation of velocity of propagation of seismic waves (e.g., where seismic velocity depends on type of seismic wave and on direction of propagation of the wave). As to the seismic processing 252, it may include a set of processes allowing identification of localization of seismic reflectors in space, physical characteristics of the rocks in between these reflectors, etc.

As to the facies and petrophysical property interpolation 253, it may include an assessment of type of rocks and of their petrophysical properties (e.g. porosity, permeability), for example, optionally in areas not sampled by well logs or coring. As an example, such an interpolation may be constrained by interpretations from log and core data, and by prior geological knowledge.

As to the flow simulation 254, as an example, it may include simulation of flow of hydro-carbons in the subsurface, for example, through geological times (e.g., in the context of petroleum systems modeling, when trying to predict the presence and quality of oil in an un-drilled formation) or during the exploitation of a hydrocarbon reservoir (e.g., when some fluids are pumped from or into the reservoir).

As to geomechanical simulation 255, it may include simulation of the deformation of rocks under boundary conditions. Such a simulation may be used, for example, to assess compaction of a reservoir (e.g., associated with its depletion, when hydrocarbons are pumped from the porous and deformable rock that composes the reservoir). As an example a geomechanical simulation may be used for a variety of purposes such as, for example, prediction of fracturing, reconstruction of the paleo-geometries of the reservoir as they were prior to tectonic deformations, etc.

As to geochemical simulation 256, such a simulation may simulate evolution of hydrocarbon formation and composition through geological history (e.g., to assess the likelihood of oil accumulation in a particular subterranean formation while exploring new prospects).

As to the various applications of the applications block 240, the well prognosis application 242 may include predicting type and characteristics of geological formations that may be encountered by a drill-bit, and location where such rocks may be encountered (e.g., before a well is drilled); the reserve calculations application 244 may include assessing total amount of hydrocarbons or ore material present in a subsurface environment (e.g., and estimates of which proportion can be recovered, given a set of economic and technical constraints); and the well stability assessment application 246 may include estimating risk that a well, already drilled or to-be-drilled, will collapse or be damaged due underground stress.

As to the operational decision block 260, the seismic survey design process 261 may include deciding where to place seismic sources and receivers to optimize the coverage and quality of the collected seismic information while minimizing cost of acquisition; the well rate adjustment process 262 may include controlling injection and production well schedules and rates (e.g., to maximize recovery and production); the well trajectory planning process 263 may include designing a well trajectory to maximize potential recovery and production while minimizing drilling risks and costs; the well trajectory planning process 264 may include selecting proper well tubing, casing and completion (e.g., to meet expected production or injection targets in specified reservoir formations); and the prospect process 265 may include decision making, in an exploration context, to continue exploring, start producing or abandon prospects (e.g., based on an integrated assessment of technical and financial risks against expected benefits).

Figure 3:
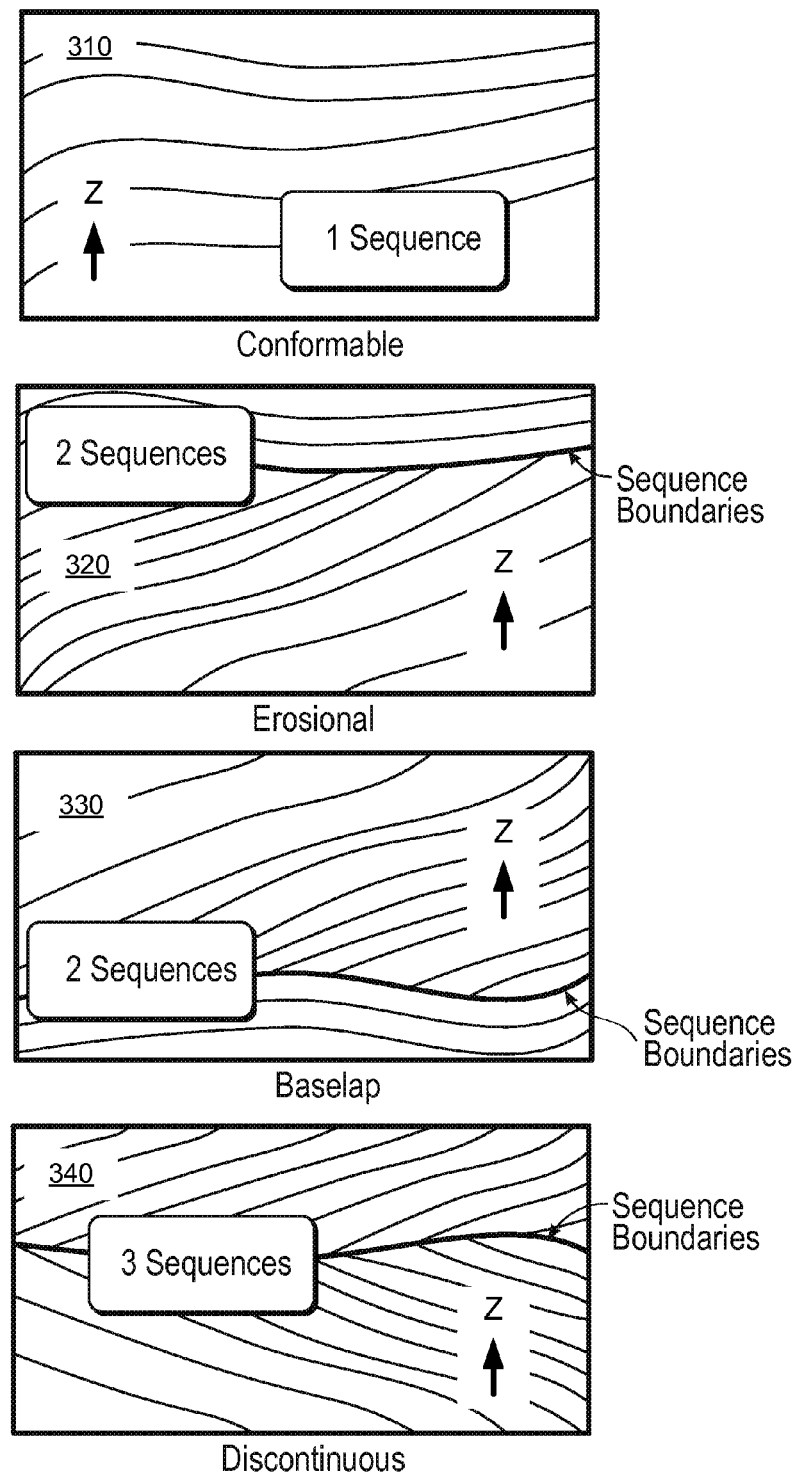
FIG. 3 illustrates examples of conformities and unconformities.

FIG. 3 shows examples of formations that include one or more sequences, for example, sequences of sedimentary structures (e.g., strata, horizons, etc.) occurring in sedimentary rocks. As shown in FIG. 3, the formation 310 includes a single sequence, the formations 320 and 330 each include two sequences and the formation 340 includes three sequences, the middle sequence being collapsed into a single discontinuity surface.

As an example, a conformable horizon may be a horizon between a lower horizon and an upper horizon where the horizons have undergone a relatively common geologic history, for example, being deposited in succession (e.g., continuous in time). Referring to the formation 310, the horizons do not intersect one another and each of the horizons may be considered conformable to adjacent horizons (e.g., lower and upper or older and younger).

As an example, erosion may act to denude rock, for example, as a result of physical, chemical and/or biological breakdown and/or transportation. Erosion may occur, for example, as material (e.g., weathered from rock, etc.) is transported by fluids, solids (e.g., wind, water or ice) or mass-wasting (e.g., as in rock falls and landslides). Referring to the formation 320, of the two sequences shown, the lower sequence may have been eroded and the upper sequence deposited on top of the eroded lower sequence. In such an example, the boundary between the two sequences may be referred to as an erosion; noting that it is conformable to the upper, younger sequence. As an example, erosion may act to "truncate" a sequence of horizons and to form surface upon which subsequent material may be deposited (e.g., optionally in a conformable manner).

As an example, a baselap may be a type of feature in a formation, for example, such as a downlap or an onlap. As an example, a downlap may be a termination of more steeply dipping overlying strata against a surface or underlying strata that have lower apparent dips. For example, a downlap may be seen at the base of prograding clinoforms and may represent progradation of a basin margin. As to an onlap, for example, it may be a termination of shallowly dipping, younger strata against more steeply dipping, older strata (e.g., sequence stratigraphy that may occur during periods of transgression). Referring to the formation 230, given the indicated direction "z" as depth, the type of baselap shown may be considered as a downlap (e.g., lower strata having lower apparent dips). In such an example, the baselap boundary is conformable to immediately older horizons (lower sequence).

As to the formation 340, it includes three sequences and may be referred to as a discontinuity as the boundary is neither conformable to older horizons nor to younger ones. In the examples of FIG. 3, erosions, baselaps and discontinuities may be referred to as unconformities or non-conformable horizons (e.g., or surfaces, layers, etc.).

Figure 4:
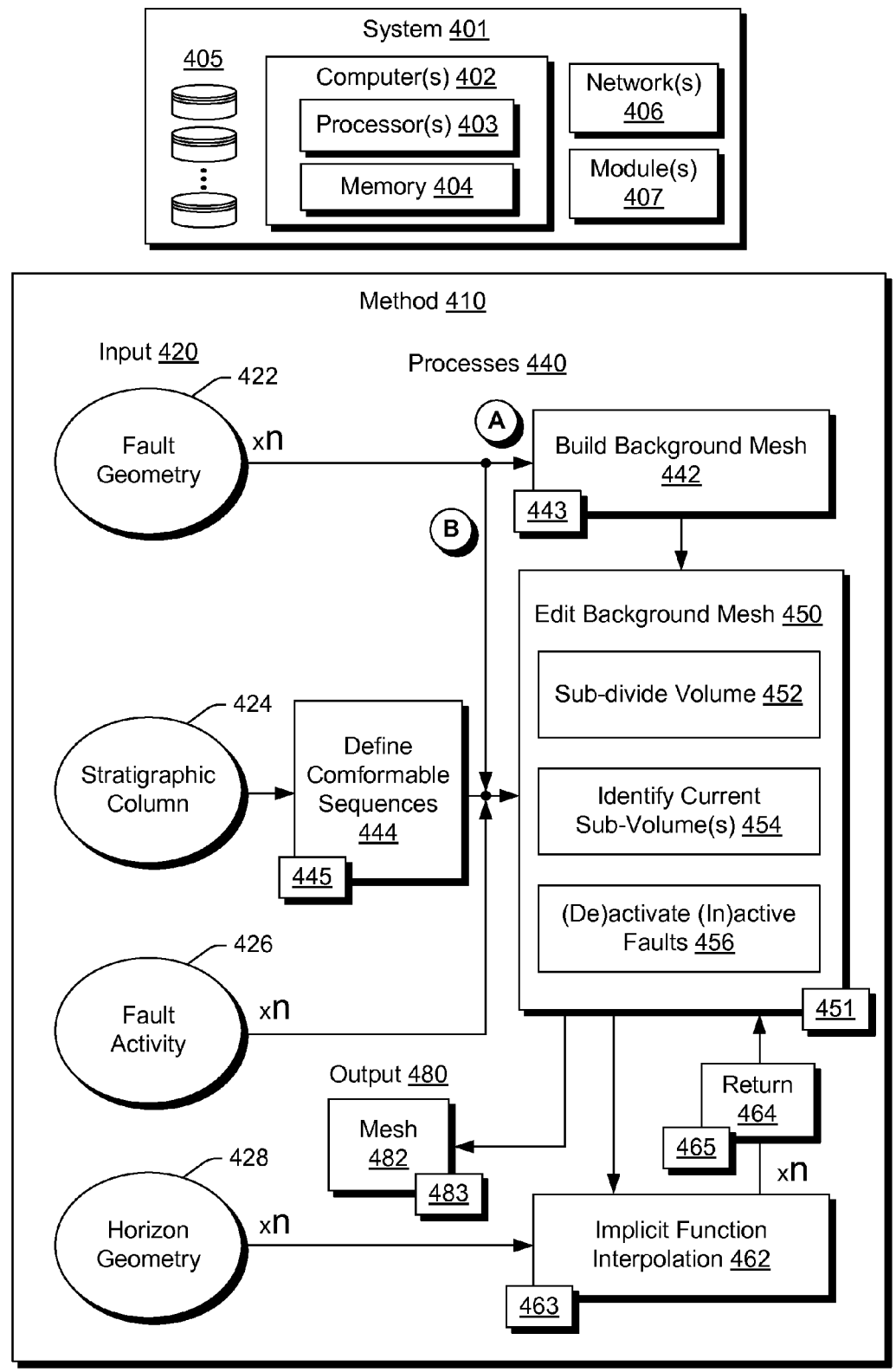
FIG. 4 illustrates an example of a system and an example of a method.

FIG. 4 shows an example of a system 401 and a method 410. As shown in FIG. 4, the system 401 includes one or more computers 402, one or more storage devices 405, one or more networks 406 and one or more modules 407. As to the one or more computers 402, each computer may include one or more processors (e.g., or processing cores) 403 and memory 404 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, data may be provided in the storage device(s) 405 where the computer(s) 402 may access the data via the network(s) 406 and process the data via the module(s) 407, for example, as stored in the memory 404 and executed by the processor(s) 403.

As shown in FIG. 4, the method 410 includes input 420, processes 440 and output 480. As to the input 420, the method 410 may receive, for example, fault geometry input per an input block 422, stratigraphic column input per an input block 424, fault activity input per an input block 426 and horizon geometry input per an input block 428. As indicated, the processes 440 can include a build block 442 for building a background mesh, a definition block 444 for defining conformable sequences, an edit block 450 for performing one or more edit procedures per blocks 452, 454 and 456, an implicit function interpolation block 462 for interpolating an implicit function (e.g., or implicit functions) and a return block 464, which may return to the edit block 450, for example, after performing one or more interpolations per the implicit function interpolation block 462. As an example, the method 410 can include outputting a mesh as output 480 per a mesh output block 482, for example, where the output mesh may be suitable for one or more purposes.

As an example, the method 410 may include receiving a background mesh (e.g., built per the mesh block 442), receiving one or more conformable sequences (e.g., defined per the definition block 444) and editing the received background mesh using the received one or more conformable sequences (e.g., per the edit block 450) to provide an edited mesh. In such an example, the method 410 may include populating the edited mesh with values of an implicit function via an interpolation procedure (e.g., per the implicit function interpolation block 462) based at least in part on receiving, as input, horizon geometry (e.g., per the input block 428). In such an example, the method 410 may include outputting a mesh that is or may be "split" into multiple volumes along one or more unconformities (see, e.g., the formations 320, 330 and 340 of FIG. 3). For example, the method 410 may include outputting a mesh (e.g., per the mesh output block 482). In turn, a model of a geologic environment may be constructed at least in part using such a mesh.

As an example, a method may be implemented that can create a model (e.g., a multidimensional spatial model) of a faulted stratigraphic sequence (e.g., faulted geological layers). Such a method may include creating a model that represents one or more unconformities, for example, where an unconformity may be a domain boundary that separates younger rock from older rock (e.g., consider a gap in a geological time record). As an example, a method may create a model for use in modeling structures, phenomena, etc. in one or more dimensions. As an example, a model may be suited for modeling structures, phenomena, etc. with respect to time (e.g., a time dimension, whether forward, backward or both). As an example, a method that includes performing one or more numerical techniques may use a model, for example, to discretize a geologic environment (e.g., in one or more dimensions) and to formulate sets of equations that correspond to at least a portion of the discretized geologic environment. For example, a model may include nodes, a grid defined by nodes, cells (e.g., consider two-dimensional cells and three-dimensional cells), etc.

As an example, a method such as the method 410 may account for real geometrical input, for example, without necessarily having to model or interpret eroded or non-deposited parts of layers, or eroded parts of faults. As an example, a method may include constructing a geological model in the form of a mesh or of a set of meshes, such that the model is watertight, for example, where one or more faults, conformable layers and unconformities may be represented by meshes (e.g., optionally resulting from splitting of a mesh) that have contacts (i.e. no geometrical gaps or overlaps) with each other. As an example, a method may include accounting for fault activity, for example, where faults may be eroded by some conformable sequences while introducing a discontinuity in younger sequences, in a geologically consistent manner. As an example, a method may be tolerant to geometrical inaccuracies in the interpretation of such eroded faults, and may produce geologically meaningful results even if the fault interpretation is going past the erosion surface that should be truncating it.

As an example, a method may include modeling simultaneously (e.g., representing by a single implicit function on a volume mesh), horizons that belong to a particular conformal sequence (e.g., including one or more sequence boundaries where one or more may be an unconformity). For example, referring to the example formations 320, 330 and 340 of FIG. 3, a method may include modeling successively each of the conformable sequences subject to a sequence boundary (e.g., or boundaries) that may be an unconformity (e.g., an erosion, a baselap, a discontinuity, etc.), for example, by representing conformal sequences by one or several implicit functions defined on separate (e.g., topologically disconnected) elements of a background mesh. Such an approach may provide for reliable and accurate modeling of conformable or nonconformable horizons, for example, which may at times be defined by sparse data (e.g., consider well tops data).

Referring again to the method 410 of FIG. 4, examples of Options A and B are shown with respect to the fault geometry input block 422. For Option A, the input block 422 may provide input to the build block 442 for use in building a background mesh; whereas, for Option B, the fault geometry input block 422 may provide input to the edit block 450. For Option A, as an example, a background mesh may be built by the build block 442 such that the background mesh is constrained, at least in part, by geometry of a fault or faults. For Option B, as an example, a background mesh may be unconstrained by geometry of a fault or faults while editing per the edit block 450 takes into account geometry of a fault or faults.

The method 410 of FIG. 4 may be referred to as an implicit modeling technique as it includes using one or more implicit functions. As an example, such a method can include representing geological horizons in three-dimensions using specific iso-surfaces of a scalar property field (e.g., an implicit function) defined on a three-dimensional background mesh. In such an example, continuity of the scalar field property may be governed by continuity of the background mesh (see, e.g., the example mesh of FIG. 14, which is described further below).

As an example, a method can include building a background mesh suitable for interpolating an implicit function (see, e.g., the example mesh of FIG. 10, which is described further below), identifying a set of conformable sequences from the geological type of stratigraphic horizons, and editing the background mesh on which the interpolation is performed for processing of a first conformable sequence or between processing of two successive conformable sequences. As to such editing, it may include creating sub-volumes in the background mesh by subdividing it by previously interpolated sequence boundaries (see, e.g., the subdivision block 452 of FIG. 4 and the example mesh of FIG. 13, which is split into two meshes and described further below), identifying sub-volumes corresponding to a "current" conformable sequence (see, e.g., the identification block 454 of FIG. 4) and restricting further interpolation and iso-surface extraction processes to the identified sub-volumes and, for example, managing fault activity in one or more of the identified sub-volumes (see, e.g., the (de)activate (in)activate block 456 of FIG. 4), for example, by introducing and/or removing one or more internal discontinuities in the background mesh (see, e.g., the example mesh of FIG. 14, which is described further below).

Figure 11:
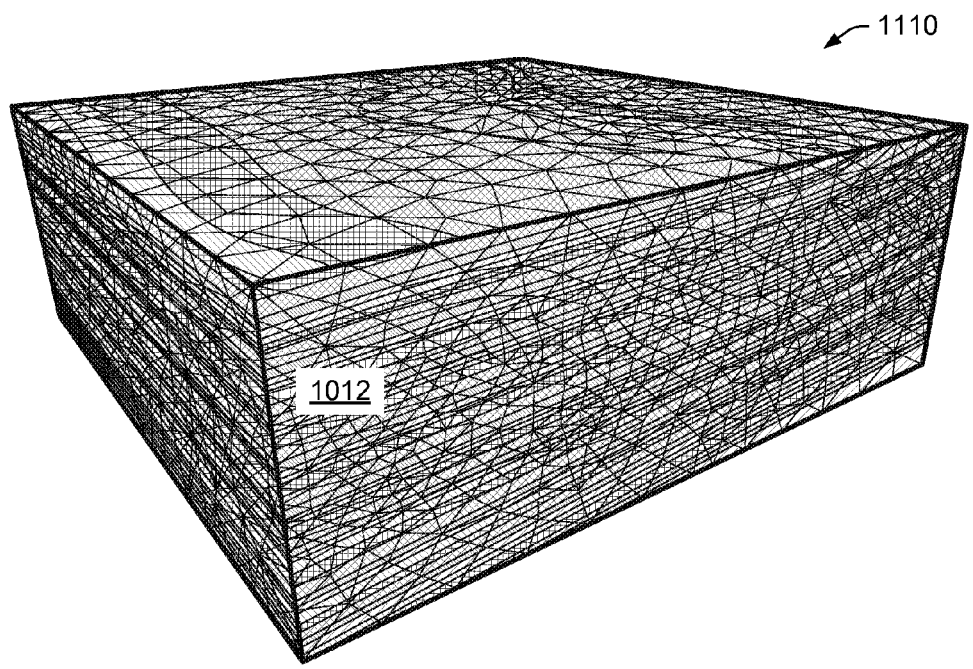
FIG. 11 illustrates an example of a mesh in a volume of interest.
Figure 12:
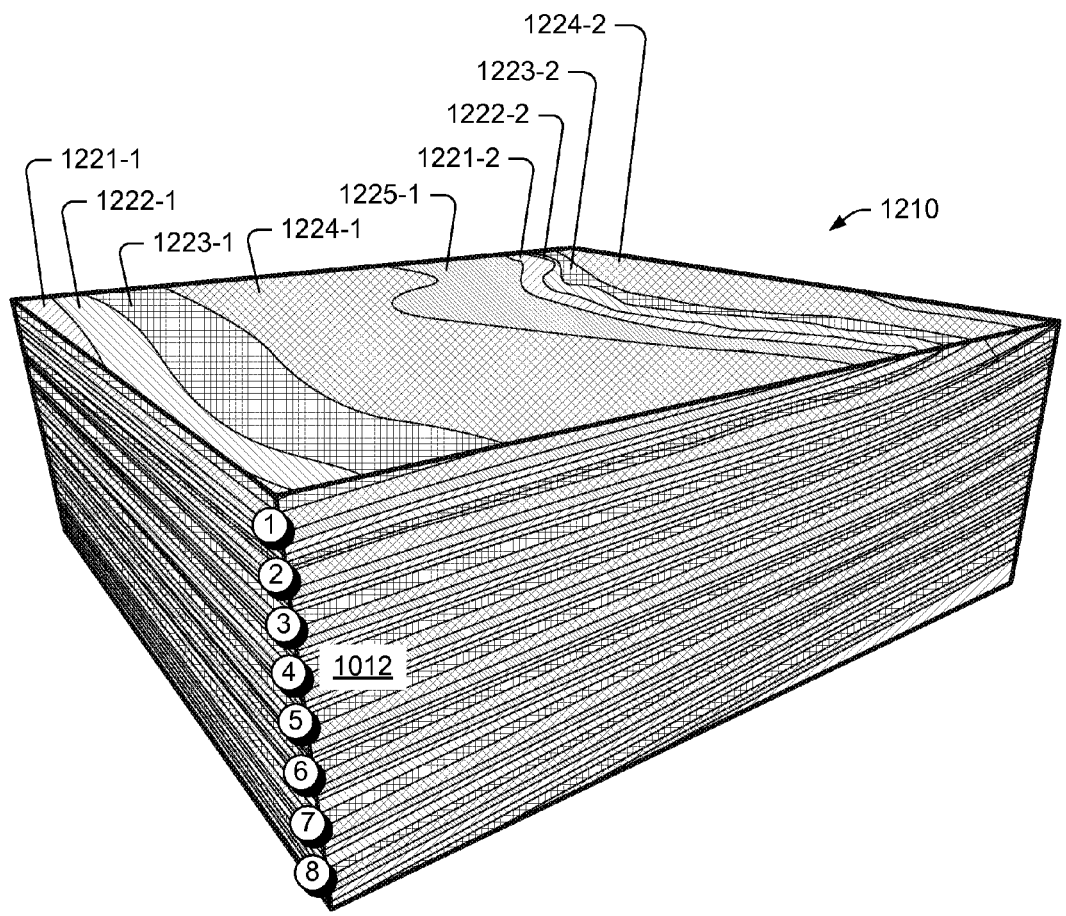
FIG. 12 illustrates an example of volume attribute values in a volume of interest.

As to processing one or more implicit functions, a method can include interpolating one or more implicit functions on a "conformable sequence per conformable sequence" basis, for example, optionally one conformable sequence at a time (see, e.g., the example meshes of FIGS. 11 and 12).

In the example of FIG. 4, the method 410 includes a return block 464 whereby results from the implicit function interpolation block 462 may be provided to the edit block 450 to perform one or more additional edits to the edited background mesh. As an example, a loop may exist between the edit block 450 and the implicit function interpolation block 462, for example, where various actions may be repeated to process a stratigraphic pile (e.g., for modeling the stratigraphic pile). As an example, an isovalue of a previously interpolated implicit function that corresponds to an unconformity (e.g., a sequence boundary) may be used as input to sub-divide block 452, As mentioned, the method 410 can include output 480, for example, which may output a mesh (e.g., or meshes) per the mesh output block 482. As an example, a mesh (e.g., or meshes) may be considered a model of a geologic environment.

The method 410 is shown in FIG. 4 in association with various computer-readable media (CRM) blocks 443, 445, 451, 463, 465 and 483. Such blocks generally include instructions suitable for execution by one or more processors (or cores) to instruct a computing device or system to perform one or more actions. While various blocks are shown, a single medium may be configured with instructions to allow for, at least in part, performance of various actions of the method 410. As an example, a computer-readable medium (CRM) may be a computer-readable storage medium. As an example, the blocks 443, 445, 451, 463, 465 and 483 may be provided as one or more modules, for example, such as the one or more modules 407 of the system 401 of FIG. 4.

FIG. 5 shows an example of a control point constraints formulation 510 with respect to a tetrahedral cell 512 that includes a control point 514 and an example of a linear system formulation 530. As an example, an implicit function may be a scalar field. As an example, an implicit function may be represented as a property or an attribute, for example, for a volume (e.g., a volume of interest). As an example, the aforementioned PETREL® framework may include a volume attribute that includes spatially defined values that represent values of an implicit function.

As an example, a function "F" may be defined for coordinates (x, y, z) and equated with an implicit function denoted φ. As to constraint values, the function F may be such that each input horizon surface "I" corresponds to a known constant value $h_i$ of φ. For example, FIG. 5 shows nodes (e.g., vertices) of the cell 512 as including $a_0$, $a_1$, $a_2$ and $a_3$ as well as corresponding values of φ (see column vector). As to the values value $h_i$ of φ, if a horizon I is younger than horizon J, then $h_i > h_j$ and, if one denotes T_ij* as an average thickness between horizons I and J, then $(h_k-h_i)/(h_j-h_i) \sim$ T_ik*/Tij*, for which a method can include estimating values of T_ij* before an interpolation is performed. Note that the method may accept lower values $h_i$ of φ for younger horizons, the only constraint being that, within each conformal sequence, the values $h_i$ of φ vary monotonously with respect to the age of the horizons.

As to interpolation of "F", as an example, φ may be interpolated on nodes of a background mesh (e.g., a triangulated surface in 2D, a tetrahedral mesh in 3D, a regular structured grid, quad/octrees, etc.) according to several constraints that may be honored in a least squares sense. In such an example, as the background mesh may be discontinuous along faults, interpolation may be discontinuous as well; noting that "regularization constraints" may be included, for example, for constraining smoothness of interpolated values.

As an example, a method may include using fuzzy control point constraints. For example, at a location of interpretation points, $h_i$ of φ (see, e.g. point a* in FIG. 5). As an example, an interpretation point may be located at a location other than that of a node of a mesh onto which an interpolation is performed, for example, as a numerical constraint may be expressed as a linear combination of values of φ at nodes of a mesh element (e.g. a tetrahedron, tetrahedral cell, etc.) that includes the interpretation point (e.g., coefficients of a sum being barycentric coordinates of the interpretation point within the element or cell).

For example, for an interpretation point p of a horizon I located inside a tetrahedron which includes vertices are $a_0$, $a_1$, $a_2$ and $a_3$ and which barycentric coordinates are $b_0$, $b_1$, $b_2$ and $b_3$ (e.g., such that the sum of the barycentric coordinates is approximately equal to 1) in the tetrahedron, an equation may be formulated as follows:

$$b_0 \phi(a_0) + b_1 \phi(a_1) + b_2 \phi(a_2) + b_3 \phi(a_3) = h_i$$

where unknowns in the equation are $\phi(a_0)$, $\phi(a_1)$, $\phi(a_2)$ and $\phi(a_3)$. For example, refer to the control point φ(a*), labeled 514 in the cell 512 of the control point constraints formulation 510 of FIG. 5, with corresponding coordinates (x*,y*,z*); noting a matrix "M" for coordinates of the nodes or vertices for $a_0$, $a_1$, $a_2$ and $a_3$, (e.g., $x_0$, $y_0$, $z_0$ to $x_3$, $y_3$, $z_3$).

As an example, the number of such constraints of the foregoing type may be based on the number of interpretation points where, for example, interpretation points may be decimated interpretation for improving performance.

As mentioned, a process can include various regularization constraints, for example, for constraining smoothness of interpolated values, of various orders (e.g., constraining smoothness of φ or of its gradient ∇φ, which may be combined through a weighted least squares scheme.

As an example, a method can include constraining the gradient ∇φ in a mesh element (e.g. a tetrahedron, a tetrahedral cell, etc.) to take a (weighted) arithmetic average of values of the gradients of φ in with respect to its (topological) neighbors. As an example, one or more weighting schemes may be applied (e.g. by volume of an element) and for defining of a topological neighborhood (e.g., by face adjacency).

As an example, two geometrically "touching" mesh elements that are located on different sides of a fault may be deemed not topological neighbors, for example, as a mesh may be "unsewn" along fault surfaces (e.g., to define a set of elements or a mesh on one side of the fault and another set of elements or a mesh on the other side of the fault).

As an example, within a mesh, if one considers a mesh element $m_i$ that has n neighbors $m_j$ (e.g., for a tetrahedron), one may formulate an equation of the regularization constraint as follows:

$$\nabla \varphi(m_i) = \frac{1}{n} \sum_{j=1}^{n} \nabla \varphi(m_j)$$

In such an example of a regularization constraint, solutions for which isovalues of the implicit function would form a "flat layer cake" or "nesting balls" geometries may be considered "perfectly smooth" (i.e. not violating the regularization constraint), it may be that a first one is targeted.

As an example, one or more constraints may be incorporated into a system in linear form. For example, hard constraints may be provided on nodes of a mesh (e.g., a control node). In such an example, data may be from force values at the location of well tops. As an example, a control gradient, or control gradient orientation, approach may be implemented to impose dip constraints.

Referring again to FIG. 5, the linear system formulation 530 includes various types of constraints. For example, a formulation may include harmonic equation constraints, control point equation constraints (see, e.g., the control point constraints formulation 510), gradient equation constraints, constant gradient equation constraints, etc. As shown in FIG. 5, a matrix A may include a column for each node and a row for each constraint. Such a matrix may be multiplied by a column vector such as the column vector $\phi(a_i)$ (e.g., or φ), for example, where the index "i" corresponds to a number of nodes, vertices, etc. for a mesh (e.g., a double index may be used, for example, $a_{ij}$, where j represents an element or cell index). As shown in the example of FIG. 5, the product of A and the vector φ may be equated to a column vector F (e.g., including non-zero entries where appropriate, for example, consider $\phi_{control\ point}$ and $\phi_{gradient}$).

FIG. 6 shows a block diagram of an example of a method 610 that includes an input block 620 and output block 680, for example, to output an implicit function equated to a stratigraphic property per a block 682. As to the input block 620, it may include a fault surfaces input block 622 and a horizon points input block 624. As shown in the example of FIG. 6, the input block 620 may provide input to a thickness estimation block 630, a layer block 640 and a background mesh block 652.

As to the layer block 640, it can include a thickness values block 642 for determining or receiving thickness values (e.g., based on or from the thickness estimation block 630) and a computation block 644 for computing control point values (see, e.g., the formulations 510 and 530 of FIG. 5). As shown, the layer block 640 can output control points to a control points block 662, which may be defined with respect to a mesh provided by the background mesh block 652. As an example, the control points of the control points block 662 may account for one or more regularization constraints per a regularization constraint block 654.

As an example, given control point values for layers definable with respect to a mesh and subject to one or more constraints, a method can include calculating values of an implicit function (e.g., or implicit functions). As shown in the example of FIG. 6, an implicit function calculation block 662 can receive control points and one or more constraints defined with respect to a mesh (e.g., elements, cells, nodes, vertices, etc.) and, in turn, calculate values for one or more implicit functions.

As to the output block 680, given calculated values for one or more implicit functions, these may be associated with, for example, a stratigraphic property per the block 682. As an example, one or more iso-surfaces may be extracted based at least in part on the values of the stratigraphic property per an iso-surface extraction block 684, for example, where one or more of the extracted iso-surfaces may be defined to be a horizon surface (e.g., or horizon surfaces) per a horizon surface block 686.

FIG. 6 also shows an example of a method 690 for outputting a volume based model (e.g., a model constructed from a subdivision of a volume of interest in sub-volumes representing stratigraphic layers, fault blocks or segments, etc). As shown, the method 690 includes an input block 691 for inputting sealed information (e.g., sealed fault framework information, horizon interpretation information, etc.), a mesh block 692 for providing or constructing a mesh, a volume attribute interpolation block 693 for interpolating values (e.g., using one or more implicit functions), an iso-surface extraction block 694 for extracting one or more iso-surfaces (e.g., based at least in part on the interpolated values), a subdivision block 695 for subdividing a meshed volume (e.g., based at least in part on one or more of the one or more extracted iso-surfaces) and an output block 696 for outputting a volume based model (e.g., based at least in part on one or more portions of a subdivided meshed volume).

As an example, the input block 691 may include one or more features of the input block 620 of the method 610, the mesh block 692 may include one or more features of the mesh block 652 of the method 610, the volume attribute interpolation block 693 may include one or more features of the implicit function calculation block 664 and/or the stratigraphic property block 682 of the method 610, the iso-surface extraction block 694 may include one or more features of the iso-surface extraction block 684 of the method 610, the subdivision block 695 may include subdividing a meshed volume using one or more horizon surfaces per the horizon surfaces block 686 of the method 610 and the output block 696 may include outputting a volume based model based at least in part on one or more outputs of the output block 680 of the method 610.

As explained with respect to the method 410 of FIG. 4, an implicit function may be provided for performing, for example, interpolation. As an example, an implicit modeling approach can include representing surfaces as iso-values of a volume attribute (e.g., of an implicit function). As an example, such a volume attribute may be referred to as being a "thickness proportion" (e.g., volumetrically filling in space). For example, an implicit function may correspond to the stratigraphic age of formations and, for example, such an implicit function may be embedded and interpolated in a volumetrically filling tetrahedral mesh (e.g., structured, unstructured, etc.).

As an example, a method can include building a tetrahedral mesh for carrying and interpolating an implicit function. As an example, a 3D boundary-constrained Delaunay mesh generator may be implemented, for example, with constraints such as constraints based on faults affecting considered horizons where such faults may be accounted for as internal boundaries during mesh generation, for example, where some border faces of tetrahedra may match fault geometries in a resulting mesh. As an implicit function may be defined and interpolated on nodes of a tetrahedral mesh, density of the mesh, and therefore the spatial resolution of the implicit function, may be controlled, for example, to include a higher density within a shell at, proximate to or around various data and/or faults (e.g., to maximize degree of freedom of an interpolation at or near various data and/or faults). As an example, a mesh adaptation process may include producing tetrahedra that have a vertical resolution higher than their areal resolution (e.g., to better capture thickness variations in layering). As an example, a resulting mesh (e.g., a built mesh) may be unstructured.

As an example, a method can include interpolating values of an implicit function on nodes of a tetrahedral mesh. As an example, an interpolation process may include using a linear least squares formulation, which may tend to minimize misfit between interpretation data and interpolated surfaces and to minimize variations of dip and thickness of layers.

As an example, a method can include generating surfaces representing individual implicitly modeled horizons. In such an example, as the specific value of the implicit function associated to each of the individual horizons may be known, a method may include using an iso-surfacing algorithm. As an example, resolution of a resulting surface or surfaces may be higher or approximately equal to a local resolution of a tetrahedral mesh around sample points (e.g., which may be user-controllable).

As an example, a method may include a volume based modeling approach that generates a consistent zone model (e.g., a model of interpreted geological layers). For example, such a zone model may include an individual geological layer that may be seen as an interval of values of an implicit function. In such an example, given its value of the implicit function, a method may determine to which layer an arbitrary point belongs, in particular where such arbitrary points correspond to nodes of a mesh supporting the implicit function.

As an example, edges of a tetrahedral mesh may intersect limits of geological layers. In such an example, construction of such intersection points may have been computed where they correspond to nodes of triangulated surfaces representing horizons. Accordingly, zones may be built by cutting edges of the tetrahedral mesh by some iso-surfaces of the implicit function.

As an example, a method can include cutting a volume to produce zones that are sets of tetrahedra. As an example, a method can include cutting volume borders to produce zones that are sets of triangulated patches. As to the latter, it may include cutting volume borders by iso-contours. As noted, one or more implicit functions may be formulated for determination of iso-surfaces and/or iso-contours that do not intersect one another other.

As an example, a volume based modeling approach may be less sensitive to complexity of a fault network and may provide conformable horizons belonging to a common conformable sequence (e.g., which may be modeled simultaneously). As to the latter, by using an implicit approach (e.g., by representing sets of conformable horizons by several iso-values of a common implicit attribute), the approach may avoid crossing of conformable horizons.

As an example, a volume based modeling approach may provide for conformable horizons that constrain geometry of other conformable horizons that belong to a common sequence, which itself may be constrained by geometry. As an example, a volume based modeling approach may be applied in scenarios where data are sparse, for example, consider data from well tops, 2D sections, etc. As an example, one or more surfaces may be modeled using seismic data and, for example, globally adjusted using well top data.

As an example, a volume based modeling approach may include outputting geometry of a horizon as well as volume attribute values, which may be defined within a volume of interest and, for example, represent a stratigraphic age, or relative chronostratigraphic age, of a formation (or formations).

Figure 7:
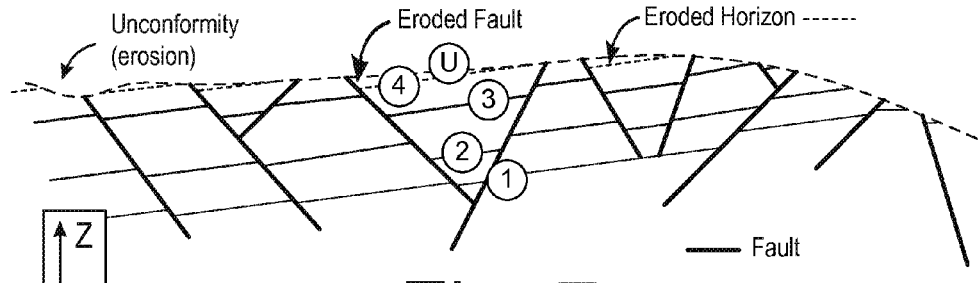
FIG. 7 illustrates an example of cross-sectional view of a geologic environment.

FIG. 7 shows a diagram 700 that represents an example of a cross-sectional view of a geologic environment. As shown, the environment includes four faulted conformable horizons and one unconformity (e.g., an erosion). In the example of FIG. 7, the faults have also been eroded and are active in the sequence below the erosion. As an example, a method may include defining an implicit function within such an environment (e.g., with respect to a mesh that models the environment) and interpolating the implicit function to provide implicit function values upon which iso-surfaces, iso-contours, etc., may be extracted.

As an example, such a method may produce correct geometries for the eroded horizons (e.g., similar to those of horizons labeled 1-4) provided that the implicit function is interpolated on a background mesh which upper boundary corresponds to unconformity U of FIG. 7.

Figure 8:
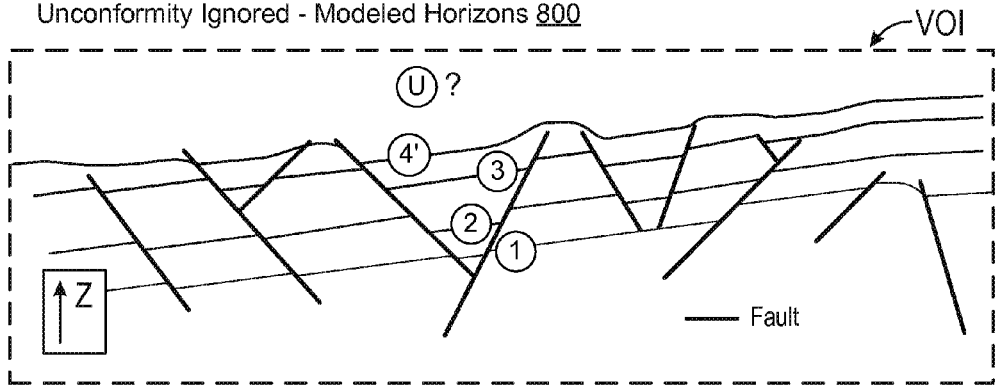
FIG. 8 illustrates an example of a model of the geologic environment of FIG. 7.

FIG. 8 shows a diagram 800 that represents an example of a model of the geologic environment of FIG. 7. In the example of FIG. 8, the model is built to represent the "real" geologic environment of FIG. 7 via interpolating or extrapolating conformable horizons within a volume of interest (VOI), including the eroded and non-deposited portions, for which no data may exist. As shown, the model of FIG. 8 does not provide a "realistic" representation of the horizons, for example, in part due to the fact that the interpolation domain is not bounded by the erosion surface U.

Figure 9:
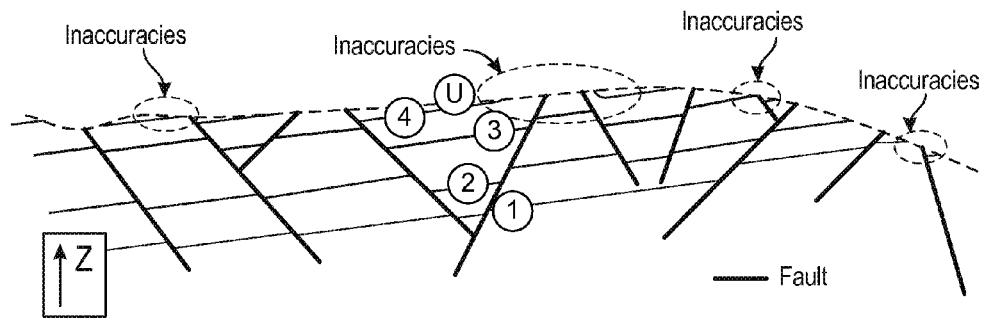
FIG. 9 illustrates an example of a model of the geologic environment of FIG. 7.

FIG. 9 shows a diagram 900 that represents an example of a model of the geologic environment of FIG. 7. In the example of FIG. 9, the model may be formed by taking the unconformity (e.g., erosion) into account by computing geometric intersections with the conformable horizons previously modeled as in FIG. 8 and, for example, removing "unreal" portions of the model of FIG. 8. A comparison between the diagram 700 of the geologic environment of FIG. 7 and the model 900 of FIG. 9 shows that inaccuracies exist, especially near the contacts between the unconformity and the conformable horizons. Again, as with the model of FIG. 8, this is due in part to the fact that the domain in which horizons 1-4 were interpolated is not bounded by the erosion surface U.

FIGS. 7, 8 and 9 illustrate that modeling an unconformity surface before eroded surfaces can enhance a modeling effort and that such an effort may include using an unconformity surface to limit a domain of interpolation of an implicit function. Such an approach may provide for more accurately modeling a real geologic environment, for example, when compared to results achieved via extrapolating fault surfaces to reconstruct their eroded geometry, which may be unpractical and not robustly automated since this eroded geometry may be unknown (e.g., where no subsurface data is available to constrain it) and since the extrapolation may include some interpretative work that may lead to incorrect or unrealistic fault and horizon geometries.

As an example, a method may provide a model of a geologic environment that represents features, for example, more accurately than the approaches described with respect to the diagrams 800 and 900 of FIGS. 8 and 9, respectively. As an example, the method 410 of FIG. 4 may include outputting one or more models (e.g., a mesh or meshes, etc.) that account for various features of a geologic environment, for example, where the output model or models is volume filling (e.g., "watertight" or "sealed").

As an example, a method may be implemented to create a reservoir model on a "conformable sequence per conformable sequence" basis, for example, where surfaces belonging to a common conformable sequence may be interpolated simultaneously. As an example, a method can include iteratively editing topology of a volume mesh, for example, to control extent of the volume in which an interpolation is performed and continuity of an interpolated implicit function. As an example, a method may include producing layering that is consistent with a geological style of deposition in one or more eroded areas.

As an example, a method can include building a background mesh, for example, where the background volume mesh covers a volume of interest (VOI), which itself may be of a size sufficient to include horizons to be modeled.

Figure 10:
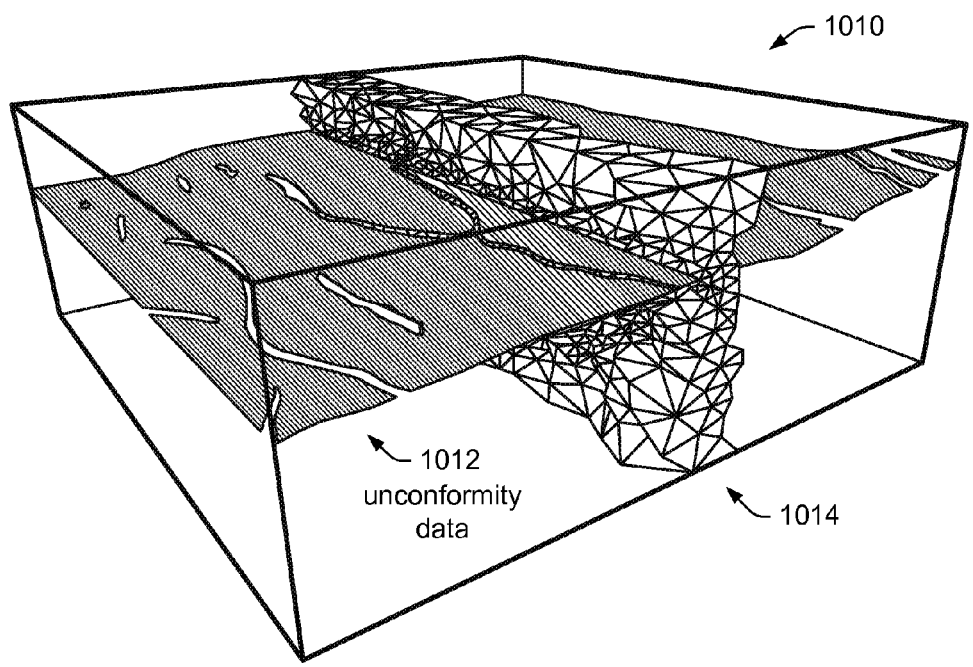
FIG. 10 illustrates an example of a portion of a mesh and an unconformity in a volume of interest.

FIG. 10 shows an example of a mesh 1010 that includes an unconformity 1012 and a "solid" vertical portion 1014 composed of connected tetrahedra. As indicated in FIG. 10, tetrahedra size may vary within a portion of the mesh 1010, for example, to better fit an interpolation process for building horizons via an implicit scheme. As to the unconformity 1012, it may be defined using seismic data or other data.

FIG. 11 shows an example of a mesh 1110 that includes the unconformity 1012 and the solid vertical portion 1014 where tetrahedra volumetrically fill the mesh 1110. In the example of FIG. 11, the mesh 1110 is also shown along with volume attribute values. In the example of FIG. 11, the volume attribute values may be displayed or represented with respect to a periodic color scale, for example, where the volume attribute or "property" may be monotonously increasing (e.g., corresponding to values of a monotonic implicit function). For example, each "period" of the periodic scale may correspond to a layer in a series of layers defined by input horizons. In such an example, an individual horizon may be conformable to another individual horizon within a common sequence.

FIG. 12 shows a volume 1210 that corresponds to the mesh 1110, however, without lines indicating mesh elements (e.g., mesh cells, etc.). In the example of FIG. 12, eight portions (portions 1 to 8) are shown as an example for purposes of explanation. For example, within these portions, a periodic scale may be repeated as indicated by black and white hatchings: 1221-1, 1222-1, 1223-1, 1224-1, 1225-1, 1221-2, 1222-2, 1222-3, 1224-2, etc., where "−1" corresponds to one portion of the volume 1210 and "−2" corresponds to another portion of the volume 1210. As mentioned, the scale may represent values of an implicit function.

Referring again to FIG. 11, the tetrahedral background mesh 1110 may be used for modeling implicitly an unconformity described by seismic data points such as the unconformity 1012 of the mesh 1010 of FIG. 10. The mesh 1110 also shows an implicit function represented by a periodic scale (e.g., whether black and white, color, etc.) that may be interpolated within the background mesh. As mentioned, FIG. 12 shows the volume 1210 without the mesh lines to more clearly illustrate an example of a periodic scale for an implicit function. As an example, the unconformity 1012 of FIG. 10 may be represented by a specific iso-surface of the implicit function.

As an example, a method may include building a mesh that includes subsets of its facets that match (e.g., in a general sense) elements of the mesh representing one or more faults.

In such an example, the facets may be approximating, in the background mesh, geometry of a fault network. As an example, a mesh may include elements with shape and size that are specified to be suitable for an interpolation process (e.g., shape, size, etc. may be specified depending on one or more characteristics of an interpolation process).

As an example, a mesh may be considered an initial mesh (e.g., or other early stage mesh) that may not include one or more internal borders, for example, that represent one or more discontinuities.

As an example, a method can include identifying one or more conformable sequences. In such an example, an identification process may include identifying a set of conformable sequences from a geological type of stratigraphic horizons, for example, provided by an operator of the system. As an example, consider one or more of the definitions provided with respect to FIG. 3 where: (a) an erosion may be an unconformity that is conformable to one or more horizons immediately younger (e.g., without gaps in the geological record) and not conformable to one or more older horizons (see, e.g., the geologic environment 700 of FIG. 7); (b) a baselap may be an unconformity that is conformable to one or more horizons immediately older (e.g., without gaps in the geological record) and not conformable to one or more younger horizons; and (c) a discontinuity may be an unconformity that is neither conformable to one or more older horizons nor to one or more younger ones. As an example, a conformable horizon may be assumed to be conformable to at least an adjacent younger horizon and at least an adjacent older horizon.

Provided with definitions for a given stratigraphic sequence that includes conformable horizons and unconformities, it may be possible to divide the sequence into subsets of conformable sequences, for example, where an individual horizon (e.g., conformable or unconformity) belongs to a single conformable sequence. For example, consider the following rules: (a) an erosion is the oldest horizon to be modeled in the conformable sequence it belongs to; (b) a baselap is the youngest horizon to be modeled in the conformable sequence it belongs to; and (c) a discontinuity is modeled alone in its "own" conformable sequence, which may be, in such a case, a conformable sequence that is degenerated to a single surface.

Through use of such rules, a produced conformable sequence may include a set of horizons that are conformable to one another, for example, meaning that they do not have any contact with one another and do not intersect one another. In such an example, an individual conformable sequence may be modeled with a single implicit function. As an example, a one-to-one correspondence may exist between conformable sequences and implicit functions.

As an example, a method can include editing a mesh (e.g., a background mesh). For example, an editing process may prepare a mesh for interpolation of an implicit function for modeling a given conformable sequence in the mesh.

FIG. 13 shows an example of a first mesh 1322 for a conformable sequence and a second mesh 1326 for a conformable sequence where the first and second mesh result from splitting of a larger mesh, for example, with respect to an unconformity such as the unconformity 1012, which may be an erosion and according to a rule associated with the younger of the two sequences (e.g., the first mesh 1322).

As mentioned with respect to the method 410 of FIG. 4, editing may include one or more processes. As an example, consider a sub-volume process that can create sub-volumes within a meshed volume of interest (VOI). As an example, sub-volumes may be first created from sub-volumes of a background mesh used to model a prior conformable sequence; noting that where a conformable sequence is a first conformable sequence, such a process may, by definition, not have a prior conformable sequence and may be created directly. As an example, a sub-volume process may include cutting sub-volumes according to one or more unconformities that may bound a conformable sequence previously modeled. For example, referring to FIG. 13, the mesh 1322 may be a conformable sequence previously modeled after which the mesh 1326 is used to model another conformable sequence.

A sub-volume process may be performed, for example, in a manner that avoids numerical instabilities where unconformities are iso-surfaces of a scalar property field defined within considered sub-volumes. In such an example, geometrical intersections between mesh elements of the unconformity (e.g., which may be triangles or other shaped faces) and the mesh elements of the sub-volumes (e.g., which may be tetrahedra or other volumes), may be one of two kinds: (i) a node of a triangle lying on an edge of a tetrahedron; or (ii) a node of a triangle being collocated with a node of a tetrahedron. Such an approach may, for example, facilitate computation of one or more geometrical intersections.

As an example, an identification process may include identifying one or more sub-volumes as corresponding to a conformable sequence. For example, where a previously modeled unconformity is modeled through a volume of interest and includes a maximum areal extension, it may intersect the volume of interest in a manner that divides the volume of interest into sub-volumes such as, for example, two subsets of new sub-volumes (see, e.g., FIG. 13). As an example, one subset of new sub-volumes may be for a sequence older than an unconformity while another subset of new sub-volumes may be for a sequence younger than the unconformity.

As an example, a method may include computing relative ages by taking an average value of an implicit function having been used to model an unconformity in a sub-volume and comparing it with a value of an iso-surface that represents the unconformity. For example, an iso-surface may be defined along a scale that corresponds to age. As an example, depending on order with which conformable sequences are modeled (e.g., from younger to older or from older to younger), one of two subsets of new sub-volumes may be selected and considered for processing a next conformable sequence. As an example, a periodic scale may be implemented to facilitate visualization of an implicit function (e.g. with respect to one or more features in a sequence).

FIG. 14 shows an example of a volume 1410 with active faults 1412-1, 1412-2, 1412-3, 1412-4 and 1412-5 and an example of a re-meshed volume 1430 to account for the active faults (e.g., mesh refinement in regions near the active faults).

As an example a method may include managing fault activity. For example, a list of faults may be provided that have been set as active for a "current" conformable sequence (e.g., meaning that they are expected to introduce a geometrical discontinuity in one or more modeled layers as in the example of FIG. 13) and compared to a list of faults that were set as active for a previously considered conformable sequence. In such an example, to enforce geological consistency, faults that were active for a younger sequence may be set as active for an older sequence. Given such a comparison, discontinuities may be created or removed in a considered sub-volume or sub-volumes of a background mesh. For example, if a subset of facets exists in the sub-volumes matching the geometry (e.g., mesh elements) of a given fault, a corresponding discontinuity may be formed by duplicating these facets and thus creating an internal border. As an example, one or more discontinuities may be removed by performing for example some local mesh editions on elements of a background mesh, As to interpolation of an implicit function corresponding to a conformable sequence, as an example, its distribution may be discontinuous across one or more internal borders of a background mesh and continuous elsewhere (see, e.g., FIGS. 11 and 12). As an example, interpolation may be performed in one or more sub-volumes of a background mesh that have been created and identified as corresponding to a "current" conformable sequence. As an example, data points that included in such one or more sub-volumes may be taken into account to constrain an interpolation of an implicit function. As an example, once an interpolation process has been performed to provide values for an implicit function, implicit horizons of the "current" conformable sequence may be transformed into explicit surfaces using one or more iso-surfacing algorithms.

Figure 15:
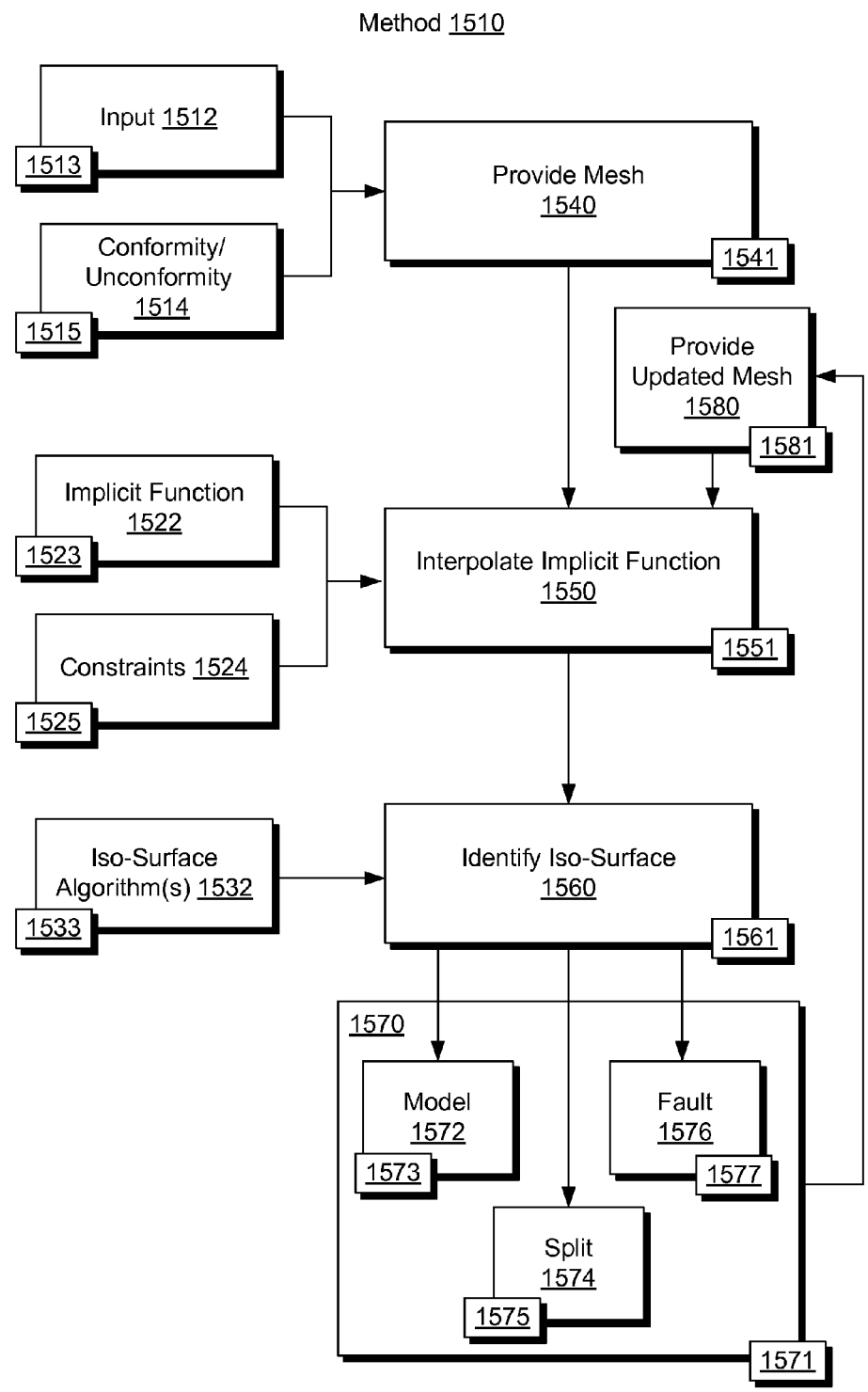
FIG. 15 illustrates an example of a method.

FIG. 15 shows an example of a method 1510 that includes a provision block 1540 for providing a mesh of a geologic environment that includes conformable sequences and an unconformity (or unconformities); an interpolation block 1550 for interpolating an implicit function defined with respect to the mesh to provide values for the implicit function; and an identification block 1560 for identifying an iso-surface based on a portion of the values where the iso-surface represents the unconformity, for example, as residing between two of the conformable sequences.

As an example, the provision block 1540 may include providing the mesh, building the mesh, editing a mesh, etc. based at least in part on receiving input from an input block 1512 and input from a conformity/unconformity block 1514. As an example, the conformity/unconformity block 1514 may provide for defining one or more unconformities in a mesh, for example, with respect to one or more conformal sequences. As an example, the conformity/unconformity block 1514 may provide data associated with an unconformity, for example, where the data is represented as values, points, etc. in a mesh.

As an example, the interpolation block 1550 may include receiving one or more implicit functions per an implicit function block 1522 and include receiving one or more constraints per a constraints block 1524. As an example, an implicit function (or implicit functions) may be constrained by one or more constraints. As an example, where a mesh includes nodes, one or more constraints may be defined with respect to a portion of those nodes. In such an example, a linear system of equations may be formulated and solved, for example, as part of an interpolation process to provide values for an implicit function (e.g., or implicit functions).

As an example, the identification block 1560 may include receiving one or more algorithms, for example, for forming iso-surfaces given values within a region or regions such as a region or regions of a mesh. For example, an algorithm may receive as input values associated with an implicit function and then define iso-surfaces for at least some of those values. As an example, an iso-surface may correspond to a horizon, an unconformity, etc. As an example, a series of iso-surfaces may correspond to a conformable sequence, for example, where the conformable sequence is at least partially bound by an unconformity, which may be represented itself as an iso-surface.

In the example of FIG. 15, the method 1510 may include a block 1570 for performing one or more additional actions. For example, a model block 1572 may provide for outputting a model based at least in part on the identified iso-surface where such a model may be used for modeling one or more physical phenomena associated with a geologic environment (e.g., including one or more processes applied to the environment such as injection, production, etc.). As an example, the block 1570 may include a splitting block 1574 for splitting or sub-dividing a mesh based at least in part on an identified iso-surface. For example, where the iso-surface corresponds to an unconformity, a mesh may be split into meshes based at least in part on that iso-surface (e.g., to form a first mesh and a second mesh where the unconformity may belong to one of the first mesh or the second mesh). As an example, the block 1570 may include a fault block 1576 for introducing one or more faults, for activation of one or more faults, for deactivation of one or more faults, etc.

As an example, the method 1510 may include a provision block 1580 for providing an updated mesh. For example, where splitting occurs per the splitting block 1574, a mesh may be updated and provided to the interpolation block 1550 for further processing. As an example, the conformity/unconformity block 1514 may provide input for updating a mesh. For example, where a mesh has been split into a first mesh and a second mesh according to a first unconformity, one of the first mesh and the second mesh may be further processed, for example, using data, etc. associated with another unconformity. In the example of FIG. 15, the method 1510 may perform iteratively, for example, by looping to edit a mesh (e.g., whether an initial provided mesh, a subsequent mesh resulting from splitting, etc.) and to perform interpolation of one or more implicit functions with respect to an edited mesh.

The method 1510 is shown in FIG. 15 in association with various computer-readable media (CRM) blocks 1513, 1515, 1523, 1525, 1533, 1541, 1551, 1561, 1571, 1573, 1575, 1577 and 1581. Such blocks generally include instructions suitable for execution by one or more processors (or cores) to instruct a computing device or system to perform one or more actions. While various blocks are shown, a single medium may be configured with instructions to allow for, at least in part, performance of various actions of the method 1510. As an example, a computer-readable medium (CRM) may be a computer-readable storage medium. As an example, the blocks 1513, 1515, 1523, 1525, 1533, 1541, 1551, 1561, 1571, 1573, 1575, 1577 and 1581 may be provided as one or more modules, for example, such as the one or more modules 407 of the system 401 of FIG. 4.

As an example, a method can include providing a mesh of a geologic environment (e.g., a two-dimensional spatial mesh or a three-dimensional spatial mesh) that includes conformable sequences and an unconformity; interpolating an implicit function defined with respect to the mesh to provide values for the implicit function; and identifying an iso-surface based on a portion of the values where the iso-surface represents the unconformity as residing between two of the conformable sequences. In such a method, the iso-surface that represents the unconformity may belong to one of the two of the conformable sequences.

As an example, a method can include using an identified iso-surface to split a mesh, for example, into a first mesh and a second mesh. As an example, a method may include interpolating an implicit function defined with respect to a first mesh or a second mesh to provide values for an implicit function and identifying another iso-surface within the first mesh or the second mesh based on a portion of the values.

As an example, a method can include selecting a first mesh or a second mesh (e.g., resulting from splitting a mesh) based at least in part on a type of unconformity associated with an identified iso-surface used to split the mesh and based at least in part on a portion of values of an implicit function for the identified iso-surface.

As an example, a method may include creating a model for modeling one or more physical phenomena based at least in part on an identified iso-surface that represents an unconformity. As an example, an unconformity may be one of an erosion, a baselap and a discontinuity; noting, for example, that one or more other types of unconformities may be defined and identified using an implicit function and interpolating values for the implicit function.

As an example, a geologic environment may include one or more faults within a portion of at least one conformable sequences, for example, represented by a mesh (e.g., or meshes).

As an example, a method may include introducing topological discontinuities to represent geological fault surfaces in a provided mesh or an edited version thereof (e.g., which may be a mesh resulting from one or more mesh splitting operations). As an example, a method may include using fault surfaces for constraining geometry and topology of mesh elements of a provided mesh (e.g., or an edited version thereof), for example, prior to introducing a topological discontinuity to the mesh.

As an example, a method may include introducing a topological discontinuity representing a fault to at least one portion of the first mesh or to at least one portion of the second mesh (e.g., where the first mesh and the second mesh result from a splitting operation based at least in part on an iso-surface). In such an example, the method may include identifying the at least one portion of the first mesh or the at least one portion of the second mesh based on, for example, sedimentological and tectonic history (e.g., of one or more regions of a volume interest).

As an example, values of an implicit function may be scalar field values. In such an example, the values may be "property" values, for example, of an attribute (e.g., consider a volume attribute). As an example, continuity of an implicit function may be governed by continuity of a mesh (e.g., of a geologic environment). As an example, a method may include using data to represent an unconformity within a mesh.

As an example, a mesh may include nodes (e.g., vertices, etc.). In such an example, a method may include defining a linear system of equations that includes constraints defined with respect to at least a portion of the nodes. As an example, a method may include interpolating an implicit function at least in part by solving a linear system of equations to provide values of the implicit function.

As an example, a system can include a processor; memory operatively coupled to the processor; and one or more modules stored in the memory that include instructions executable by the processor to instruct the system to: provide a mesh of a geologic environment that includes conformable sequences and at least one unconformity; interpolate an implicit function defined with respect to the mesh to provide values for the implicit function; and identify an iso-surface based on a portion of the values where the iso-surface represents one of the at least one unconformity as residing between two of the conformable sequences. In such an example, one or more modules stored in the memory may include instructions executable by the processor to instruct the system to edit the mesh based at least in part on an identified iso-surface. As an example, one or more modules stored in memory of a system that include instructions executable by the processor may instruct the system to define at least one unconformity as a member selected from a group consisting of an erosion, a baselap and a discontinuity; noting, for example, that one or more other types of unconformities may be defined.

As an example, one or more computer-readable storage media may include computer-executable instructions to instruct a computing device to: provide a mesh of a geologic environment that includes conformable sequences and at least one unconformity; interpolate an implicit function defined with respect to the mesh to provide values for the implicit function; and identify an iso-surface based on a portion of the values where the iso-surface represents one of the at least one unconformity as residing between two of the conformable sequences. In such an example, instructions may be included to instruct a computing device to edit the mesh based at least in part on an identified iso-surface; to instruct a computing device to define at least one of the at least one unconformity as a member selected from a group consisting of an erosion, a baselap and a discontinuity.

As an example, a method may include a performance block for performing a simulation of phenomena associated with a geologic environment using at least a portion of a mesh (e.g., or a model based on a mesh or meshes). As to performing a simulation, such a simulation may include interpolating geological rock types, interpolating petrophysical properties, simulating fluid flow, or other calculating (e.g., or a combination of any of the foregoing).

As an example, a system may include instructions to instruct a processor to perform a simulation of a physical phenomenon using at least a portion of a mesh (e.g., or a model based on a mesh or meshes) and, for example, to output results of the simulation to a display.

FIG. 16 shows components of an example of a computing system 1500 and an example of a networked system 1610. The system 1600 includes one or more processors 1602, memory and/or storage components 1604, one or more input and/or output devices 1606 and a bus 1608. In an example embodiment, instructions may be stored in one or more computer-readable media (e.g., memory/storage components 1604). Such instructions may be read by one or more processors (e.g., the processor(s) 1602) via a communication bus (e.g., the bus 1608), which may be wired or wireless. The one or more processors may execute such instructions to implement (wholly or in part) one or more attributes (e.g., as part of a method). A user may view output from and interact with a process via an I/O device (e.g., the device 1606). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1610. The network system 1610 includes components 1622-1, 1622-2, 1622-3, . . . 1622-N. For example, the components 1622-1 may include the processor(s) 1602 while the component(s) 1622-3 may include memory accessible by the processor(s) 1602. Further, the component(s) 1602-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device.

As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words "means for" together with an associated function.

The following documents are incorporated by reference herein:

Mallet, J-L, "Geomodelling", Cambridge University Press, 2001.

Ledez, D., "Modelisation d'Objets Naturels par Formulation Implicite", PhD Dissertation, Institute National Polytechnique de Lorraine, October 2003.

Frank T., et al., "3D Reconstruction of complex geological interfaces from irregularly distributed and noisy point data", Computers & Geosciences, Vol. 33, Issue 7, July 2007.

What is claimed is:

1. A method comprising:
providing a mesh to represent a faulted geological structure in a subterranean formation of a field;
identifying an interface separating a plurality of conformable sequences in the faulted geological structure;
interpolating, by a computer processor and in a first iteration, a first implicit function defined with respect to the mesh to provide values for the first implicit function, wherein the values comprise at least a first iso-value corresponding to the interface;
dividing, based at least on the first iso-value, the mesh into at least a first sub-mesh and a second sub-mesh, wherein each of the first sub-mesh and the second sub-mesh comprises at least one of the plurality of conformable sequences;
interpolating, by the computer processor and in a second iteration, a second implicit function, wherein the extent of interpolating the second implicit function is restricted to within one of the first sub-mesh and the second sub-mesh;
extracting, from the first implicit function and the second implicit function, a surface corresponding to the interface;
creating a model based at least on the surface; and
performing exploration of natural resources in the subterranean formation using the model.

2. The method of claim 1, further comprising:
identifying, based on the first iso-value, a first iso-surface to split the mesh-into the first sub-mesh and the second sub-mesh,
wherein the first iso-surface represents the interface in the first iteration.

3. The method of claim 2, further comprising:
identifying, in response to interpolating the second implicit function, a second iso-surface based on a second iso-value of the second implicit function,
wherein the second iso-surface represents an adjustment to the first iso-surface for representing the interface in the second iteration.

4. The method of claim 2, further comprising introducing a topological discontinuity representing a fault to at least one portion of the first sub-mesh or to at least one portion of the second sub-mesh.

5. The method of claim 4, further comprising identifying the at least one portion of the first sub-mesh or the at least one portion of the second sub-mesh based on sedimentological and tectonic history.

6. The method of claim 1, further comprising selecting the one of the first sub-mesh and the second sub-mesh based at least in part on a type of the interface, wherein the interface comprises a member selected from a group consisting of an erosion, a baselap and a discontinuity.

7. The method of claim 1, further comprising modeling one or more physical phenomena based at least in part on the surface that represents the interface, wherein layering in the model is defined by iso-values of the first implicit function and the second implicit function and is consistent with a geological style of deposition in an eroded area of the faulted geological structure.

8. The method of claim 1, further comprising:
associating the one of the first sub-mesh and the second sub-mesh with a stratigraphic age;
obtaining a list of faults that are active prior to the stratigraphic age;
creating, in the one of the first sub-mesh and the second sub-mesh, internal borders based at least on the list of faults, and
wherein the internal borders are used at least to enforce a discontinuity when interpolating the first implicit function.

9. The method of claim 1, wherein the faulted geological structure comprises one or more faults within a portion of at least one of the plurality of conformable sequences.

10. The method of claim 1, further comprising introducing topological discontinuities to represent geological fault surfaces in the provided mesh or an edited version thereof.

11. The method of claim 1, further comprising using fault surfaces for constraining geometry and topology of mesh elements of the provided mesh, or an edited version thereof, prior to introducing a topological discontinuity to the mesh.

12. The method of claim 1, wherein the values of the first implicit function comprise scalar field values.

13. The method of claim 1, wherein continuity of the first implicit function is governed by continuity of the mesh.

14. The method of claim 1, further comprising using data to represent the interface within the mesh.

15. The method of claim 1, wherein the mesh comprises nodes and wherein the first implicit function is defined using at least a portion of the nodes.

16. The method of claim 15, further comprising defining a linear system of equations that comprises constraints defined with respect to at least a portion of the nodes wherein interpolating the first implicit function comprises solving the linear system of equations to provide the values of the first implicit function.

17. A system comprising:
a processor;
memory operatively coupled to the processor; and
one or more modules stored in the memory that comprise instructions executable by the processor to instruct the system to:
provide a mesh to represent a faulted geological structure in a subterranean formation of a field;
identify an interface separating a plurality of conformable sequences in the faulted geological structure;
interpolate, in a first iteration, a first implicit function defined with respect to the mesh to provide values for the first implicit function, wherein the values comprise at least a first iso-value corresponding to the interface;
divide, based at least on the first iso-value, the mesh into at least a first sub-mesh and a second sub-mesh, wherein each of the first sub-mesh and the second sub-mesh comprises at least one of the plurality of conformable sequences;
interpolate, in a second iteration, a second implicit function, wherein the extent of interpolating the second implicit function is restricted to within one of the first sub-mesh and the second sub-mesh;
extract, from the first implicit function and the second implicit function, a surface corresponding to the interface;
create a model based at least on the surface; and
perform exploration of natural resources in the subterranean formation using the model.

18. The system of claim 17, further comprising one or more modules stored in the memory that comprise instructions executable by the processor to instruct the system to edit the mesh based at least in part on an identified iso-surface defined by the first iso-value.

19. One or more non-transitory computer-readable storage media comprising computer-executable instructions to instruct a computing device to:
provide a mesh to represent a faulted geological structure in a subterranean formation of a field;
identify an interface separating a plurality of conformable sequences in the faulted geological structure;
interpolate, in a first iteration, a first implicit function defined with respect to the mesh to provide values for the first implicit function, wherein the values comprise at least a first iso-value corresponding to the interface;
divide, based at least on the first iso-value, the mesh into at least a first sub-mesh and a second sub-mesh, wherein each of the first sub-mesh and the second sub-mesh comprises at least one of the plurality of conformable sequences;
interpolate, in a second iteration, a second implicit function, wherein the extent of interpolating the second implicit function is restricted to within one of the first sub-mesh and the second sub-mesh;
extract, from the first implicit function and the second implicit function, a surface corresponding to the interface;
create a model based at least on the surface; and
perform exploration of natural resources in the subterranean formation using the model.

20. The one or more non-transitory computer-readable storage media of claim 19, further comprising computer-executable instructions to instruct the computing device to edit the mesh based at least in part on an identified iso-surface defined by the first iso-value.

* * * * *